United States Patent
Ban et al.

(10) Patent No.: US 9,202,744 B1
(45) Date of Patent: Dec. 1, 2015

(54) METHODS OF FABRICATING INTERCONNECTION STRUCTURES

(71) Applicant: SK hynix Inc., Gyeonggi-do (KR)

(72) Inventors: Keun Do Ban, Gyeonggi-do (KR); Cheol Kyu Bok, Gyeongsangbuk-do (KR); Min Ae Yoo, Gyeonggi-do (KR); Jong Cheon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/573,753

(22) Filed: Dec. 17, 2014

(30) Foreign Application Priority Data

Sep. 1, 2014 (KR) .................. 10-2014-0115388

(51) Int. Cl.
| | |
|---|---|
| *H01L 21/4763* | (2006.01) |
| *H01L 21/768* | (2006.01) |
| *H01L 21/033* | (2006.01) |
| *H01L 21/02* | (2006.01) |
| *H01L 21/64* | (2006.01) |

(52) U.S. Cl.
CPC .... *H01L 21/76808* (2013.01); *H01L 21/02345* (2013.01); *H01L 21/02617* (2013.01); *H01L 21/0338* (2013.01); *H01L 21/64* (2013.01); *H01L 21/7684* (2013.01); *H01L 21/76816* (2013.01); *H01L 21/76828* (2013.01); *H01L 21/76831* (2013.01); *H01L 21/76877* (2013.01); *H01L 2221/1063* (2013.01)

(58) Field of Classification Search
USPC ............................ 257/773–776; 438/639, 637
See application file for complete search history.

(56) References Cited

U.S. PATENT DOCUMENTS

| | | | | |
|---|---|---|---|---|
| 5,970,376 | A * | 10/1999 | Chen | ................. H01L 21/02063 134/1.1 |
| 6,617,232 | B2 * | 9/2003 | Kim | .................. H01L 21/76808 257/E21.579 |
| 6,653,228 | B2 * | 11/2003 | Choi | ................. H01L 21/31116 257/E21.252 |
| 7,723,229 | B2 * | 5/2010 | Wei | .................... H01L 21/76897 257/E21.252 |
| 2007/0010092 | A1 * | 1/2007 | Zhou | ................. H01L 21/31144 438/638 |
| 2009/0206489 | A1 | 8/2009 | Li et al. | |

* cited by examiner

*Primary Examiner* — Errol Fernandes
(74) *Attorney, Agent, or Firm* — IP & T Group LLP

(57) ABSTRACT

A method of fabricating an interconnection structure according to an embodiment of the present invention, includes patterning a dielectric layer to form a first recession region, including a first nest-shaped recession region having a first width and a first line-shaped recession region having a second width, which is less than the first width. A guide spacer layer is formed on sidewalls of the first recession region to provide a second recession region including a second nest-shaped recession region in the first nest-shaped recession region. A self-assembling block copolymer material is formed to fill the second nest-shaped recession region. The self-assembling block copolymer material is annealed to form a polymer block domain and a polymer block matrix, surrounding the polymer block domain. The polymer block domain is removed to expose a portion of the dielectric layer. The exposed portion of the dielectric layer is etched to form a via cavity.

20 Claims, 71 Drawing Sheets

METHODS OF FABRICATING INTERCONNECTION STRUCTURES

CROSS-REFERENCE TO RELATED APPLICATION

The present application claims priority under 35 U.S.C 119(a) to Korean Application No. 10-2014-0115388, filed on Sep. 1, 2014, which is incorporated herein by reference in its entirety.

BACKGROUND

1. Technical Field

Various embodiments of the present invention relate to methods of fabricating fine patterns and, more particularly, to methods of fabricating interconnection structures.

2. Related Art

In the fabrication of integrated circuit (IC) devices, much effort has been focused on integrating finer patterns within a limited area on a semiconductor substrate. That is, attempts to increase the integration density of semiconductor devices have typically resulted in the formation of finer patterns. Various techniques have been proposed to form finer patterns such as small contact holes having nano-scale critical dimensions (CD), for example, from a few nanometers to tens of nanometers.

When the patterns are formed using only a photolithography process, there are some limitations in how fine the patterns may be. Image resolution limitations are due to the nature of the optical systems as well as the wavelength of exposure light used during the photolithography process. Methods of forming finer patterns using self-assembly of polymers are candidates for overcoming the image resolution limits.

Interconnection structures in semiconductor devices include conductive lines extending in a horizontal direction and conductive vias extending in a vertical direction, A dual damascene process scheme has been used to form the conductive lines and the conductive vias or contact plugs, with a filling and planarization technique using a single metal material. The dual damascene process scheme that is known in the art requires two separate lithography process steps for forming a trench in a substrate and a via hole that is spatially connected to the trench. To fabricate high performance semiconductor chips, it is necessary to densely form discrete elements such as transistors and metal lines in a limited area, requiring accurate photo masks. For example, the overlay tolerance between two photo masks used in two separate lithography process steps must be accurately controlled. These requirements make it difficult to fabricate high performance semiconductor chips using the dual damascene process. That is, if high performance semiconductor chips are fabricated using the lithography processes, manufacturing costs may increase.

SUMMARY

Various embodiments are directed to methods of fabricating interconnection structures.

According to an embodiment, a method of fabricating an interconnection structure includes forming a dielectric layer on a semiconductor substrate, patterning the dielectric layer to form a first recession region including a first nest-shaped recession region having a first width and a first line-shaped recession region having a second width less than the first width, forming a guide spacer layer on sidewalls of the first recession region to provide a second recession region including a second nest-shaped recession region that is disposed in the first nest-shaped recession region to have a third width less than the first width, forming a self-assembling block copolymer material that fills the second recession region, annealing the self-assembling block copolymer material to form a polymer block domain having a circular pillar shape and a polymer block matrix surrounding the polymer block domain to have a cylindrical shape, removing the polymer block domain, and etching the dielectric layer using the polymer block matrix as an etch mask to form a via cavity under the second nest-shaped recession region.

According to another embodiment, a method of fabricating an interconnection structure includes sequentially stacking a first dielectric layer and a second dielectric layer on a semiconductor substrate, patterning the second dielectric layer to form a first recession region including a first nest-shaped recession region having a first width and a first line-shaped recession region having a second width less than the first width and forming a guide spacer layer on sidewalls of the first recession region to provide a second recession region in the first recession region. The second recession region is formed to include a second nest-shaped recession region disposed in the first nest-shaped recession region to have a third width less than the first width and a second line-shaped recession region disposed in the first line-shaped recession region to have a fourth width less than the second width A self-assembling block copolymer material is formed to fill the second recession region. The self-assembling block copolymer material is annealed to form a circular pillar-shaped polymer block domain and a cylinder-shaped polymer block matrix surrounding the circular pillar-shaped polymer block domain in the second nest-shaped recession region. The circular pillar-shaped polymer block domain is removed. The guide spacer layer exposed by the cylinder-shaped polymer block matrix is etched to form a first via cavity. The first dielectric layer is etched using the cylinder-shaped polymer block matrix as an etch mask to form a second via cavity deeper than the first via cavity.

According to another embodiment, a method of fabricating an interconnection structure includes sequentially stacking a first dielectric layer and a second dielectric layer on a semiconductor substrate. The second dielectric layer is patterned to form a first recession region including a first nest-shaped recession region having a first width, a third nest-shaped recession region having a fifth width, and a first line-shaped recession region having a second width less than the first and fifth widths. The first line-shaped recession region is connected to the first nest-shaped recession region and spaced apart from the third nest-shaped recession region, A guide spacer layer is formed on sidewalls of the first recession region to provide a second recession region in the first recession region. The second recession region includes a second nest-shaped recession region disposed in the first nest-shaped recession region to have a third width less than the first width and a fourth nest-shaped recession region disposed in the third nest-shaped recession region to have a sixth width less than the fifth width. A self-assembling block copolymer material is formed to fill the second and fourth nest-shaped recession regions. The self-assembling block copolymer material is annealed to form a circular pillar-shaped polymer block domain and a cylinder-shaped polymer block matrix surrounding the circular pillar-shaped polymer block domain in each of the second and fourth nest-shaped recession regions. The circular pillar-shaped polymer block domains are removed. The guide spacer layer exposed by the cylinder-shaped polymer block matrixes is etched to form a first via cavity in the second nest-shaped recession region and a third via cavity in the fourth nest-shaped recession region. The first dielectric layer exposed by the first and third via cavities etched to form a second via cavity deeper than the first via cavity and a fourth via cavity deeper than the third via cavity. A second sacrificial layer is formed to fill the first recession region and the second and fourth via cavities. A portion of the second dielectric layer adjacent to the third nest-shaped recession region is etched to form a fifth nest-shaped recession region having a seventh width greater than the fifth width. The second sacrificial layer is removed to open the fifth nest-shaped recession region, the first recession region, and the second and fourth via cavities. A conductive layer is formed to fill the fifth nest-shaped recession region, the first line-shaped recession region, the second via cavity, and the fourth via cavity. The conductive layer is planarized to form a conductive pad in the fifth nest-shaped recession region, a first conductive via in the second via cavity, a second conductive via in the fourth via cavity, and a conductive line in the first line-shaped recession region, According to another embodiment, a method of fabricating an interconnection structure includes sequentially stacking a first dielectric layer and a second dielectric layer on a semiconductor substrate. The second dielectric layer is patterned to form a first recession region including a first nest-shaped recession region having a first width, a third nest-shaped recession region having a fifth width, and a first line-shaped recession region having a second width less than the first and fifth widths. The first line-shaped recession region is connected to the first nest-shaped recession region and spaced apart from the third nest-shaped recession region. A guide spacer layer is formed on sidewalls of the first recession region to provide a second recession region in the first recession region. The second recession region includes a second nest-shaped recession region disposed in the first nest-shaped recession region to have a third width less than the first width and a fourth nest-shaped recession region disposed in the third nest-shaped recession region to have a sixth width less than the fifth width. A self-assembling block copolymer material is formed to fill the second and fourth nest-shaped recession regions. The self-assembling block copolymer material is annealed to form a circular pillar-shaped polymer block domain and a cylinder-shaped polymer block matrix surrounding the circular pillar-shaped polymer block domain in each of the second and fourth nest-shaped recession regions. The circular pillar-shaped polymer block domains are removed. The guide spacer layer exposed by the cylinder-shaped polymer block matrixes is etched to form a first via cavity in the second nest-shaped recession region and a third via cavity in the fourth nest-shaped recession region. The first dielectric layer exposed by the first and third via cavities is etched to form a second via cavity deeper than the first via cavity and a fourth via cavity deeper than the third via cavity.

According to another embodiment, a method of fabricating an interconnection structure includes sequentially stacking a first dielectric layer and a second dielectric layer on a semiconductor substrate, patterning the second dielectric layer to form a first recession region including a first nest-shaped recession region having a first width and a first line-shaped recession region having a second width less than the first width, forming a guide spacer layer in the first recession region to provide a second nest-shaped recession region having a third width less than the first width in the first nest-shaped recession region and to fill the first line-shaped recession region, forming a self-assembling block copolymer material that fills the second nest-shaped recession region, annealing the self-assembling block copolymer material to form a circular pillar-shaped polymer block domain and a cylinder-shaped polymer block matrix surrounding the circular pillar-shaped polymer block domain, removing the circular pillar-shaped polymer block domain, etching the guide spacer layer exposed by the cylinder-shaped polymer block matrix to form a first via cavity, and etching the first dielectric layer exposed by the first via cavity to form a second via cavity deeper than the first via cavity.

According to another embodiment, a method of fabricating an interconnection structure includes sequentially stacking a first dielectric layer and a second dielectric layer on a semiconductor substrate. The second dielectric layer is patterned to form a first recession region including a third nest-shaped recession region having a fifth width and a first line-shaped recession region having a second width less than the fifth width. The first line-shaped recession region is spaced apart from the third nest-shaped recession region. A guide spacer layer is formed on sidewalls of the first recession region to provide a second recession region in the first recession region. The second recession region includes a fourth nest-shaped recession region disposed in the third nest-shaped recession region to have a sixth width less than the fifth width. A self-assembling block copolymer material is formed to fill the second nest-shaped recession region. The self-assembling block copolymer material is annealed to form a circular pillar-shaped polymer block domain and a cylinder-shaped polymer block matrix surrounding the circular pillar-shaped polymer block domain. The circular pillar-shaped polymer block domain is removed. The guide spacer layer exposed by the cylinder-shaped polymer block matrix is etched to form a third via cavity. The first dielectric layer exposed by the third via cavity is etched to form a fourth via cavity deeper than the third via cavity. A portion of the second dielectric layer adjacent to the third nest-shaped recession region is etched to form a fifth nest-shaped recession region having a seventh width greater than the fifth width. A conductive layer is formed to fill the fifth nest-shaped recession region, the first line-shaped recession region, and the fourth via cavity. The conductive layer is planarized to form a conductive pad in the fifth nest-shaped recession region, a second conductive via in the fourth via cavity, and a conductive line in the first line-shaped recession region.

BRIEF DESCRIPTION OF THE DRAWINGS

Embodiments of the present invention will become more apparent in view of the attached drawings and accompanying detailed description, in which.

DETAILED DESCRIPTION OF THE EMBODIMENTS

Figure 1:
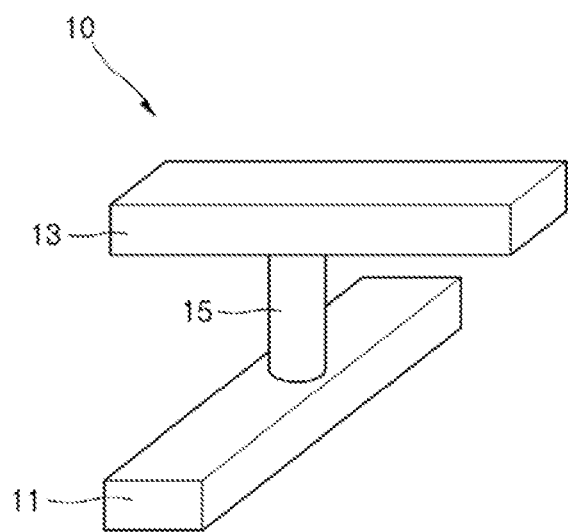
FIG. 1 is a perspective view illustrating an interconnection structure according to an embodiment of the present invention.

It will be understood that although the terms first, second, third etc. may be used herein to describe various elements, these elements should not be limited by these terms. These terms are only used to distinguish one element from another element, Thus, a first element in some embodiments could be termed a second element in other embodiments without departing from the teachings of the present invention. As used herein, the term "and/or" includes any and all combinations of one or more of the associated listed items.

It will also be understood that when an element is referred to as being located "under", "beneath," "below", "lower," "over", "above," "upper" "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the scope of the present invention. Other words used to describe the relationship between elements or layers should be interpreted in a like fashion such as, "between" versus "directly between," "adjacent" versus "directly adjacent," "on" versus "directly on".

Various embodiments of the present invention provide methods of fabricating interconnection structures by applying phase separation of a block co-polymer (BCP) material to a damascene process scheme. For example, a direct self-assembly (DSA) process using phase separation of a BCP material may be applied to the formation of a via hole to form conductive vias and conductive lines having nano-scale feature size, with only a single lithography process step. That is, the DSA process using phase separation of a BCP material may be applied to a damascene process scheme to form conductive vias that self-align with damascene conductive lines and require only a single lithography process step.

The DSA process may be performed substantially within a region where a via contact hole is formed, by forming a damascene trench having a first width for a conductive line and a damascene nest having a second width greater than the first width for a conductive via, by forming a guide spacer on sidewalls of the damascene trench and the damascene nest, and by selectively phase-separating the BCP material only in the damascene nest surrounded by the guide spacer. Accordingly, a via contact hole having nano-scale feature size may be formed using the phase-separated BCP material as an etch mask without any additional photolithography processes.

The conductive via formed in the via contact hole may be aligned with the conductive line formed in the damascene trench. The conductive via may be separated from the conductive line when viewed in a plan view. If the conductive via overlaps with the conductive line, the conductive via and conductive line may be formed using a dual damascene process scheme. That is, the conductive via may align with the conductive line which is formed to fill a damascene trench. If the conductive via is separated from the conductive line, a via contact hole may be formed by applying the DSA process to the damascene process. Thus, a photolithography process step for forming the via contact hole may be omitted. In either case the via contact hole may be filled with a conductive layer to form the conductive via when the damascene trench is filled with the conductive layer to form the conductive line. That is, the conductive via and the conductive line may be simultaneously formed.

According to the following embodiments, specific polymer blocks in a BCP material may be ordered and phase-separated to form a domain portion under specific conditions, and the phase-separated domain portion may be selectively removed to form a via contact hole having nano-scale feature size. Thus, conductive vias of the interconnection structure may have nano-scale feature size, that is, a few nanometers to tens of nanometers.

Various embodiments of the present invention may be applied to fabrication of highly integrated semiconductor devices, for example, phase changeable random access memory (PcRAM) devices, resistive random access memory (ReRAM) devices including arrays of storage nodes and interconnection lines. Moreover, the following embodiments may be applied to forming conductive vias and conductive lines that are regularly or irregularly arrayed. In addition, the following embodiments may be applied to the formation of memory devices such as static random access memory (SRAM) devices, flash memory devices, magnetic random access memory (MRAM) devices and ferroelectric random access memory (FeRAM) devices or to the formation of logic devices such as control devices, central processing units (CPU) and arithmetic logic units (ALU).

FIG. 1 is a perspective view illustrating an interconnection structure 10 according to an embodiment of the present invention.

Referring to FIG. 1, the interconnection structure 10 may have two conductive lines 11 and 13 at two different levels and a conductive via 15 that connects the conductive line 11 to the conductive line 13. The lower conductive line 11 may correspond to a word line of a semiconductor device. However, in some embodiments, the lower conductive line 11 may be a junction region, such as a semiconductor layer doped with impurities or a conductive pad of a semiconductor device. The conductive via 15 may also be referred to as a via contact plug that electrically connects the lower conductive line 11 to the upper conductive line 13. The conductive via 15 should vertically align with a portion of the upper conductive line 13 to contact the upper conductive line 13. In an embodiment of the present invention, the conductive via 15 aligns with the upper conductive line 13.

In some embodiments of the present invention, parallel upper conductive lines 13 and parallel lower conductive lines 11 are arranged to form an array. Then, a plurality of conductive vias 15 may be disposed to electrically connect each of the upper conductive lines 13 to at least one of the lower conductive lines 11. Various semiconductor devices may be designed having conductive vias 15 that are regularly arrayed. However, in most cases, the conductive vias 15 will be irregularly arrayed. Irregularly arrayed conductive vias 15 may require additional photolithography process steps. According to the embodiments, randomly arrayed conductive vias 15 may be formed using phase separation of a BCP material and a damascene process without any additional photolithography processes.

Figure 2:
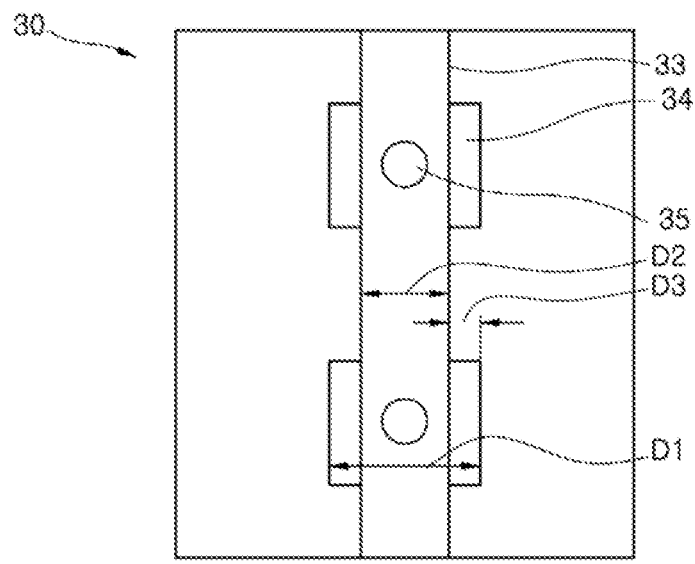
FIGS. 2 and 3 are layout diagrams illustrating an interconnection structure according to an embodiment of the present invention.
Figure 3:
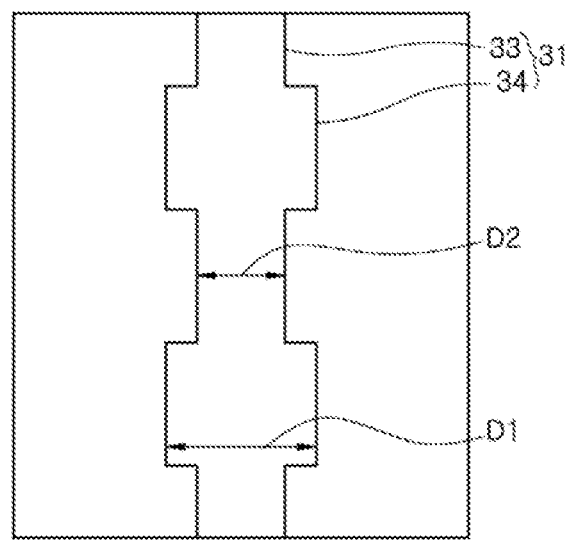

FIG. 2 is a layout diagram 30 illustrating an interconnection structure according to an embodiment of the present invention, and FIG. 3 is a layout diagram of a damascene recession region required to form an interconnection structure having the layout diagram 30 shown in FIG. 2.

Referring to FIGS. 2 and 3, the layout diagram 30 shows the conductive via 15 and the upper conductive line 13 illustrated in FIG. 1 using a damascene process. The layout 33 may be a trench layout or a first line-shaped recession layout for forming the upper conductive line 13. Thus, the layout 33 may have a linear shape having a second width D2.

A via cavity layout 35, that is, a via hole layout or a contact hole layout, for forming the conductive via 15 may overlap with a portion of the first line-shaped recession layout 33 for forming the upper conductive line 13, and a portion of the first line-shaped recession layout 33 including the via cavity layout 35 may be enlarged by a third width D3 on each side to obtain a first nest-shaped recession layout 34 having a first width D1 which is greater than the second width 12. The first nest-shaped recession layout 34 may form a recessed region corresponding to the via cavity layout 35 that is aligned with the first line-shaped recession layout 33 and may provide a space where a BCP material is phase-separated. The first nest-shaped recession layout 34 and the first line-shaped recession layout 33 may overlap to form a first recession layout 31 (see FIG. 3). The first recession layout 31 may be designed such that the first width D1 of the first nest-shaped recession layout 34 is greater than the second width D2 of the first line-shaped recession layout 33. This is for inducing phase separation of a BCP material in only a space region formed by the first nest-shaped recession layout 34. The terms "first width D1", "second width D2" and "third width D3" are only naming conventions and should not be construed as a limitation.

Figure 4:
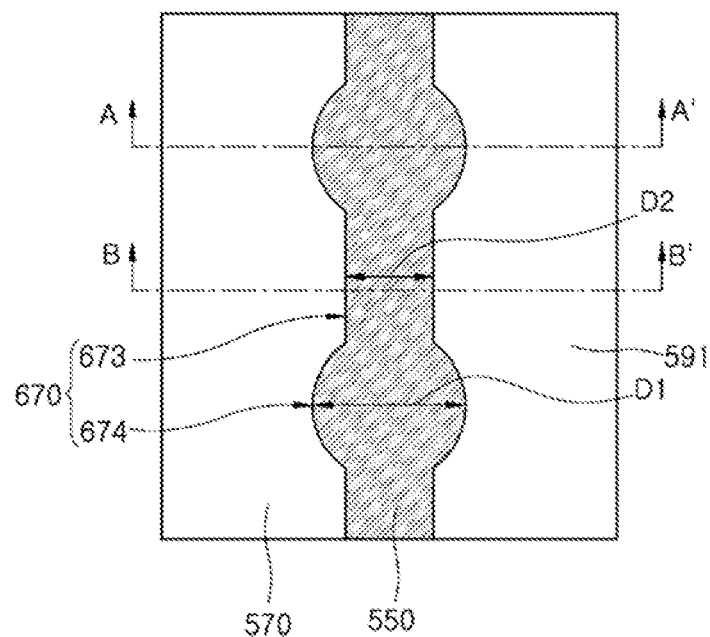
FIGS. 4 to 36 are plan views and cross-sectional views illustrating a method of fabricating an interconnection structure according to an embodiment of the present invention.
Figure 5:
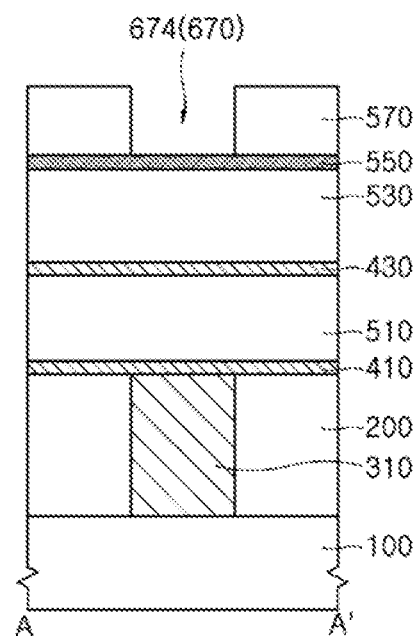
Figure 6:
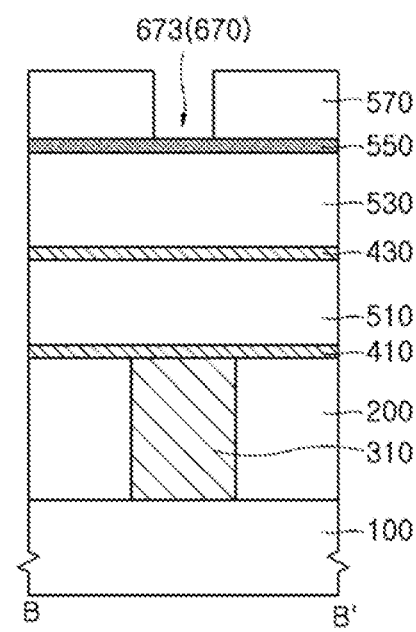

FIGS. 4, 5 and 6 illustrate the step of forming an etch mask 570. FIG. 4 is a plan view illustrating the etch mask 570. FIG. 5 is a cross-sectional view taken along a fine A-A' of FIG. 4, and FIG. 6 is a cross-sectional view taken along a line B-B' of FIG. 4.

Referring to FIGS. 4, 5 and 6, an insulation layer 200 and a lower conductive line 310 in the insulation layer 200 may be formed on a semiconductor substrate 100. The lower conductive line 310 may correspond to the lower conductive line 11 of the interconnection structure 10 shown in FIG. 1. In some embodiments of the present invention the lower conductive line 310 may correspond to a conductive pad or a junction region, for example, a source region or a drain region of a MOS transistor, The lower conductive line 310 may be a metal line. The insulation layer 200 may be formed to include a dielectric layer such as a silicon oxide ($SiO_2$) layer.

A dielectric structure including a plurality of dielectric layers 410, 510, 430, 530 and 550 may be formed on the lower conductive line 310 and the insulation layer 200. Although FIGS. 5 and 6 illustrate an example in which the dielectric structure includes the plurality of dielectric layers 410, 510, 430, 530 and 550 sequentially stacked, the inventive concept is not limited thereto. For example, in some embodiments of the present invention, the dielectric structure may be formed of a single dielectric layer. The dielectric layer 410 may be formed on the lower conductive line 310 and the insulation layer 200 to act as a first hard mask layer, and the dielectric layer 510 may be formed on the first hard mask layer 410 to act as a first dielectric layer. The dielectric layer 430 may be formed on the first dielectric layer 510 to act as a second hard mask layer, and the dielectric layer 530 may be formed on the second hard mask layer 430 to act as a second dielectric layer. The first hard mask layer 410 and the second hard mask layer 430 may function as etch stoppers. That is, the first hard mask layer 410 may be formed of a material layer having an etch selectivity with respect to the first dielectric layer 510, and the second hard mask layer 430 may be formed of a material layer having an etch selectivity with respect to the second dielectric layer 530. In some embodiments, the first and second hard mask layers 410 and 430 may be formed of a silicon nitride ($Si_3N_4$) layer. The first and second dielectric layers 510 and 530 may be formed of the same dielectric material. Alternatively, the first dielectric layer 510 may be formed of a different dielectric material than the second dielectric layer 530. The dielectric layer 550 acting as a third hard mask layer may be formed on the second dielectric layer 530. The third hard mask layer 550 may be formed to include a material layer having an etch selectivity with respect to the second dielectric layer 530. For example, the third hard mask layer 550 may be formed of a silicon nitride layer.

The etch mask 570 may be formed on the dielectric structure (410+510+430+530+550). Specifically, a photoresist layer may be formed on the third hard mask layer 550, and the photoresist layer may be exposed by an exposure step of a photolithography process with a photo mask having the first recession Payout 31 shown in FIG. 3. Subsequently, the exposed photoresist layer may be developed to form the etch mask 570 including an opening 670 therein. The shape of the opening 670 may be determined by the first recession layout 31. During the exposure step and the development step of the photolithography process, corner portions of the first nest-shaped recession layout 34 of the first recession layout 31 may instead be rounded. Thus, a first opening 674 corresponding to the first nest-shaped recession layout 34 may have a circular shape. During the exposure step and the development step of the photolithography process, the first line-shaped recession layout 33 of the first recession layout 31 may be transferred onto the photoresist layer to form a second opening 673.

Figure 7:
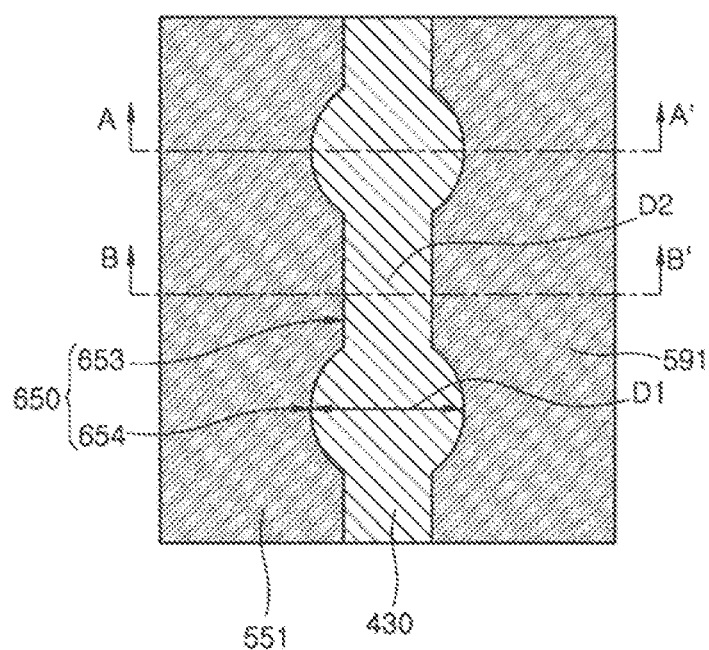
Figure 8:
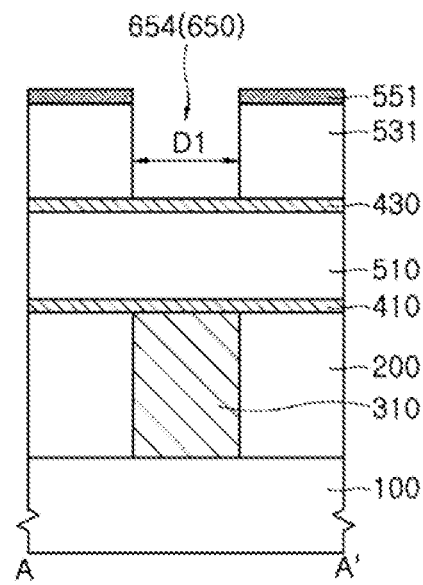
Figure 9:
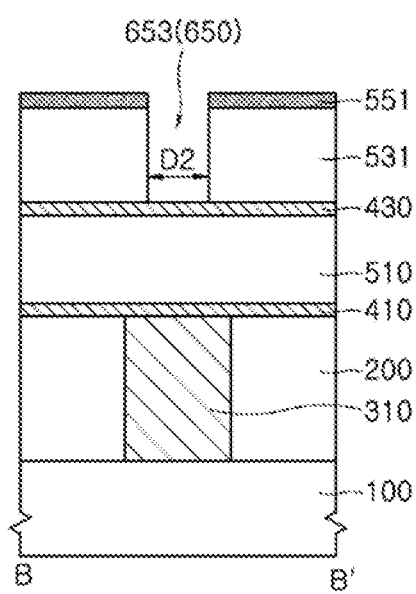

FIGS. 7, 8 and 9 illustrate the forming of a first recession region 650. FIG. 7 is a plan view illustrating the first recession region 650. FIG. 8 is a cross-sectional view taken along a line A-A' of FIG. 7, and FIG. 9 is a cross-sectional view taken along a line B-B' of FIG. 7.

Referring to FIGS. 7, 8 and 9, a portion of the third hard mask layer 550 exposed by the etch mask 570 may be selectively etched to form a third hard mask pattern 551, and a portion of the second dielectric layer 530 exposed by the third hard mask pattern 551 may be selectively etched to form a second dielectric pattern 531. As a result of the selective etch process, the opening (670 of FIGS. 5 and 6) may be transferred into the second dielectric layer 530 to form a first recession region 650 including a first nest-shaped recession region 654 and a first line-shaped recession region 653. Accordingly, the shape of the first recession region 650 may be determined by the first recession layout 31 described with reference to FIG. 3. That is, the first nest-shaped recession region 654 may have approximately the first width D1, and the first line-shaped recession region 653 may have approximately the second width D2, which is less than the first width D1. While the selective etch process forms the first recession region 650, the second hard mask layer 430 may act as an etch stopper. Thus, the first nest-shaped recession region 654 and the first line-shaped recession region 653 may have approximately the same depth.

Figure 10:
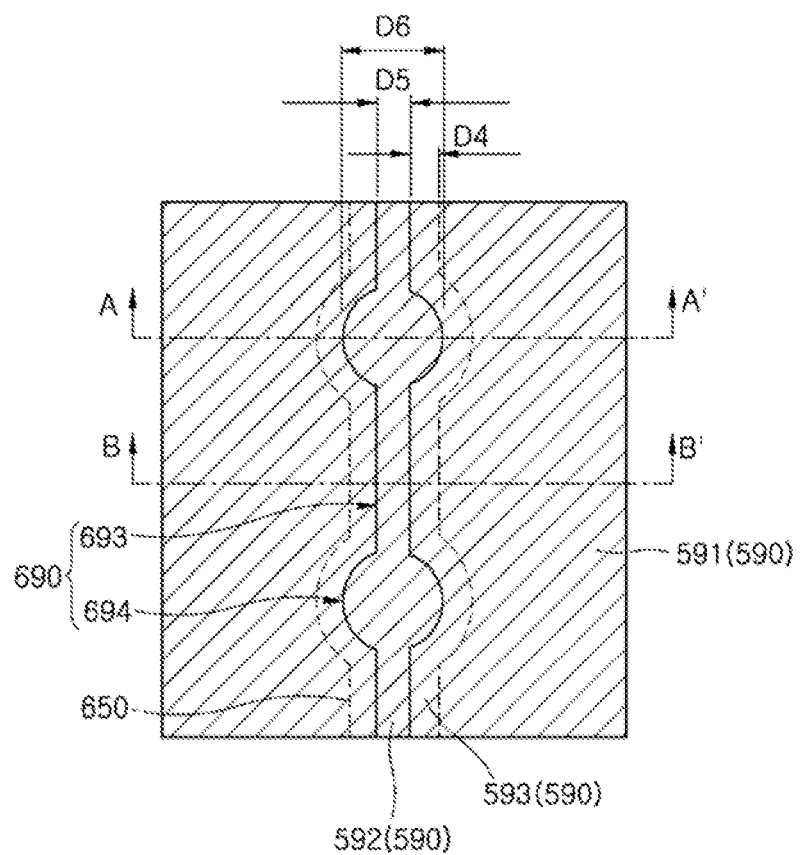
Figure 11:
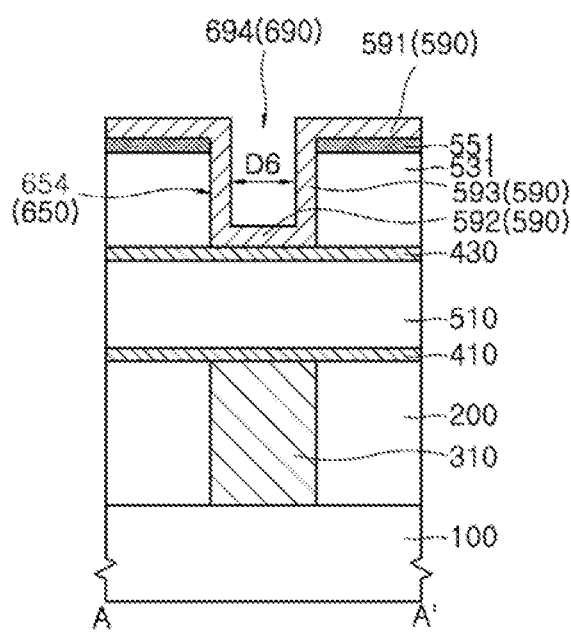
Figure 12:
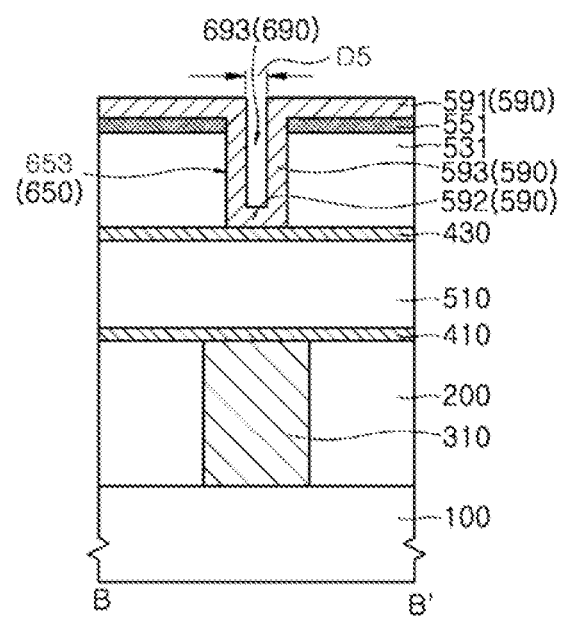

FIGS. 10, 11 and 12 illustrate a step of forming a guide spacer layer 590. FIG. 10 is a plan view illustrating the guide spacer layer 590. FIG. 11 is a cross-sectional view taken along a line A-A' of FIG. 10, and FIG. 12 is a cross-sectional view taken along a line B-B' of FIG. 10.

Referring to FIGS. 10, 11 and 12 the guide spacer layer 590 may be formed on the third hard mask pattern 551 to conformably cover sidewalls and a bottom surface of the first recession region 650. The guide spacer layer 590 may be formed to include a material layer having an etch selectivity with respect to the second dielectric pattern 531. The guide spacer layer 590 may include a metal nitride layer such as a titanium nitride (TiN) layer or a silicon layer such as a poly-silicon layer. Although not shown in the drawings, in some embodiments of the present invention, the guide spacer layer 590 may be etched back to leave guide spacers, for example, corresponding to portions indicated by reference number 531 of FIGS. 11 and 1, sidewalls of the first recession region 650. However, in the present embodiment, the guide spacer layer 590 is not etched back.

Figure 13:
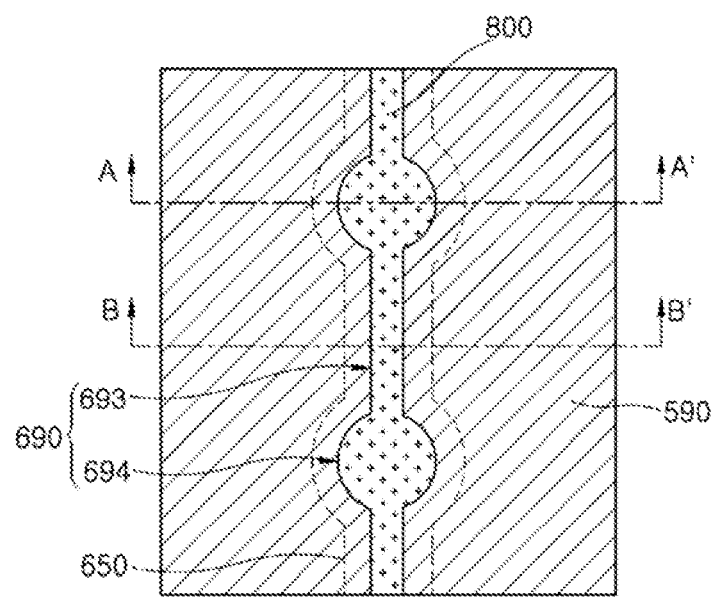
Figure 14:
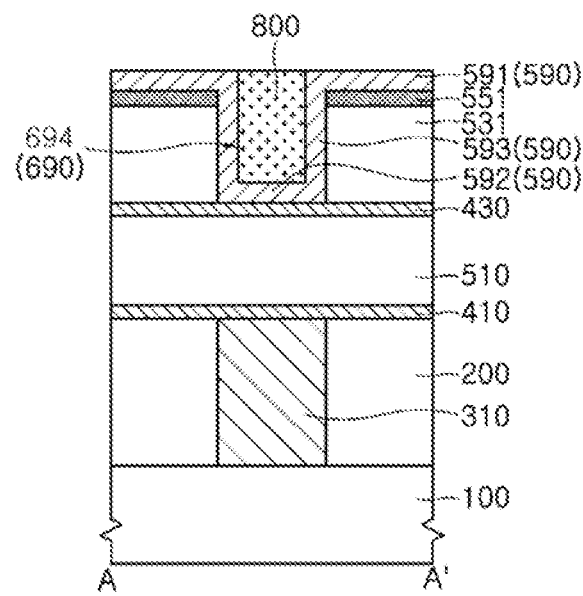
Figure 15:
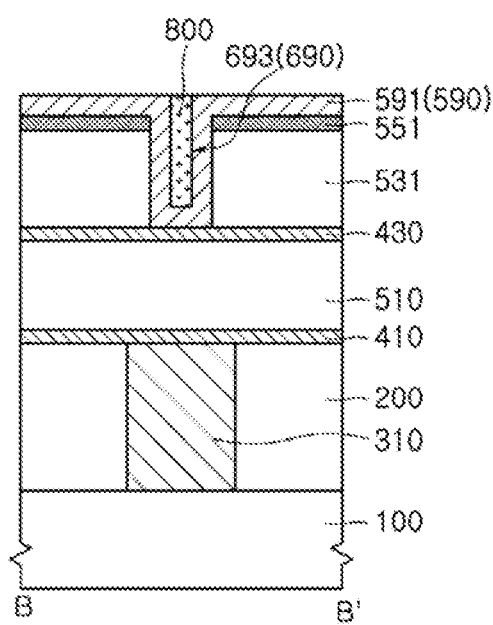

Since the guide spacer layer 590 is formed to cover the sidewalls of the first recession region 650, the actual width of the first recession region 650 may be reduced due to the presence of the guide spacer layer 590. Accordingly, the guide spacer layer 590 may provide a second recession region 690 having a width which is less than the width of the first recession region 650 by twice the width, that is, a fourth width D4 of the guide spacer layer 590, which is on the sidewalls of the first recession region 650. The guide spacer layer 590 may provide a second nest-shaped recession region 694, having a sixth width D6 which is less than the first width D1 by twice the fourth width D4, in the first nest-shaped recession region 654 and may provide a second line-shaped recession region 693, having a fifth width D5 which is less than the second width D2 by twice the fourth width D4, in the first line-shaped recession region 653, The fourth width D4 of the guide spacer layer 590 may be determined such that the phase separation of a BCP material is restricted in the second line-shaped recession region 693 having the fifth width D5. This prevents a via hole or a via opening, corresponding to the via cavity layout 35 of FIG. 2, from being formed in the second line-shaped recession region 693. This is since BCP material phase-separates only in spaces having a width that is greater than a critical width, and does not phase-separate in a space having a width which is less than the critical width. Accordingly, the guide spacer layer 590 may be introduced into the present embodiment to provide a specific space, for example, the second nest-shaped recession region 694 in which a BCP material can phase-separate. That is, the sixth width D6 of the second nest-shaped recession region 694 may be greater than the critical width to allow phase separation of a BCP material in the second nest-shaped recession region 694. The fifth width D5 of the second line-shaped recession region 693 may be narrower than the critical width so as to do not allow phase separation of a BCP material in the second line-shaped recession region 693. FIGS. 13, 14 and 15 illustrate a step of forming a BCP material 800. FIG. 13 is a plan view illustrating the BCP material 800. FIG. 14 is a cross-sectional view taken along a line A-A' of FIG. 13, and FIG. 15 is a cross-sectional view taken along a line B-B' of FIG. 13.

Referring to FIGS. 13, 14 and 15, the BCP material 800 may be coated to fill the second recession region 690. The BCP material 800 may be formed of a polystyrene-poly(meta methyl acrylate) (PS-PMMA) co-polymer material or a polystyrene-poly(di-methyl siloxane) (PS-PDMS) co-polymer material. When the BCP material 800 is formed of a PS-PMMA co-polymer material including PS blocks and PMMA blocks, the volume ratio of the PS blocks to the PMMA blocks may be controlled to be about 7:3. The volume ratio of the PS blocks to the PMMA blocks or molecular weights of the PS block and the PMMA block may be appropriately controlled according to the process scheme.

Figure 96:
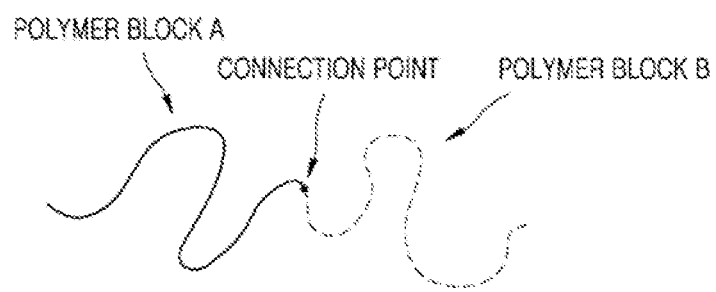
FIGS. 96 to 98 are schematic views illustrating phase separations of block co-polymer (BCP) materials according to embodiments of the present invention.
Figure 97:
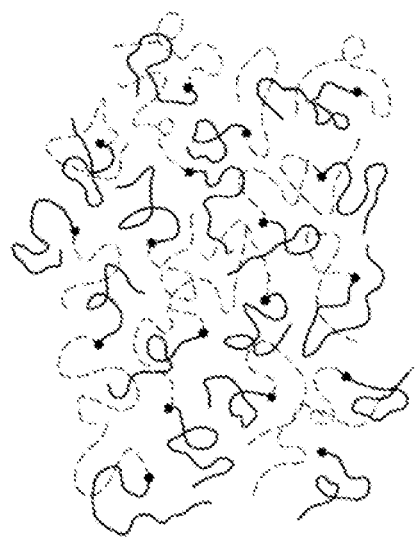

The BCP material 800 may be a functional polymer material in which polymer blocks having two or more distinct structures are combined with each other by a covalent bond to constitute a single block copolymer, as illustrated in FIG. 96. As illustrated in FIG. 96, a single block copolymer of the BCP material 800 may form a chain where polymer block A and polymer block B are connected to each other by a covalent bond through a connection point. The BCP material 800 may be applied having a homogeneous phase, as illustrated in FIG. 97.

Figure 98:
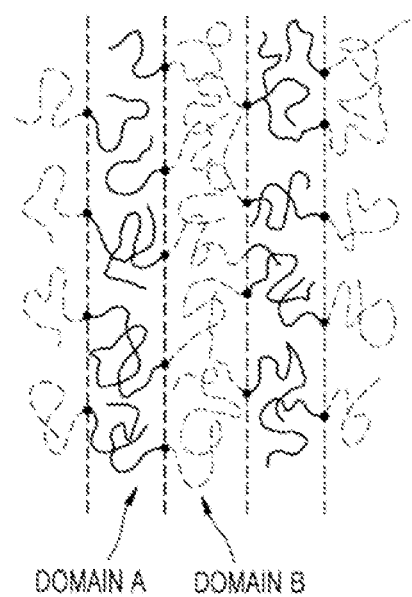

The distinctly structured polymer blocks of the BCP material 800 may have different miscibility and solubilities, due to their chemical structures. The polymer blocks having distinct structures are immiscible with each other at a certain temperature. Thus, the BCP material 800 may be phase-separated using an annealing process to provide a self-aligned structure, as illustrated in FIG. 98. That is, the BCP material 800 having a homogeneous phase may be phase-separated by an annealing process into a domain A, where polymer blocks A are arranged, and a domain B, where polymer blocks B are arranged. As such, polymer blocks of the BCP material 800 may be phase-separated or selectively dissolved in a liquid state or in a solid state to form a self-assembled structure.

Forming a nano-scale structure with a specific shape through self-assembly of a BCP material 800 is influenced by the physical properties and/or chemical properties of the polymer blocks of the BCP material 800. When a BCP material consisting of two distinct polymer blocks is self-assembled on a substrate, the self-assembled structure of the BCP material may form a three-dimensional cubic shape, a three-dimensional double helix shape, a two-dimensional hexagonal packed column shape, or a two-dimensional lamella shape, depending on the volume ratio, annealing temperature during phase separation and the molecular size of the polymer blocks constituting the BCP material.

In some embodiments, the BCP material 800 may be formed of polybutadiene-polybutylmethacrylate block co-polymer, polybutadiene-polydimethylsiloxane block co-polymer, polybutadiene-polymethylmethacrylate block co-polymer, polybutadienepolyvinylpyridine block co-polymer, polybutylacrylate-polymethylmethacrylate block co-polymer, polybutylacrylate-polyvinylpyridine block co-polymer, polyisoprene-polyvinylpyridine block co-polymer, polyisoprene-polymethylmethacrylate block co-polymer, polyhexylacrylatepolyvinylpyridine block co-polymer, polyisobutylene-polybutylmethacrylate block co-polymer, polyisobutylene-polymethylmethacrylate block co-polymer, polyisobutylene-polybutylmethacrylate block co-polymer, polyisobutylenepolydimethylsiloxane block co-polymer, polybutylmethacrylatepolybutylacrylate block co-polymer, polyethylethylene-polymethylmethacrylate block co-polymer, polystyrene-polybutylmethacrylate block co-polymer, polystyrene-polybutadiene block co-polymer, polystyrene-polyisoprene block co-polymer, polystyrene-polydimethylsiloxane block co-polymer, polystyrene-polyvinylpyridine block co-polymer, polyethylethylene-polyvinylpyridine block co-polymer, polyethylene-polyvinylpyridine block co-polymer, polyvinylpyridinepolymethylmethacrylate block co-polymer, polyethyleneoxide-polyisoprene block co-polymer, polyethyleneoxide-polybutadiene block co-polymer, polyethyleneoxide-polystyrene block co-polymer, polyethyleneoxidepolymethylmethacrylate block co-polymer, polyethyleneoxide-polydimethylsiloxane block co-polymer, or polystyrene-polyethyleneoxide block co-polymer.

Figure 16:
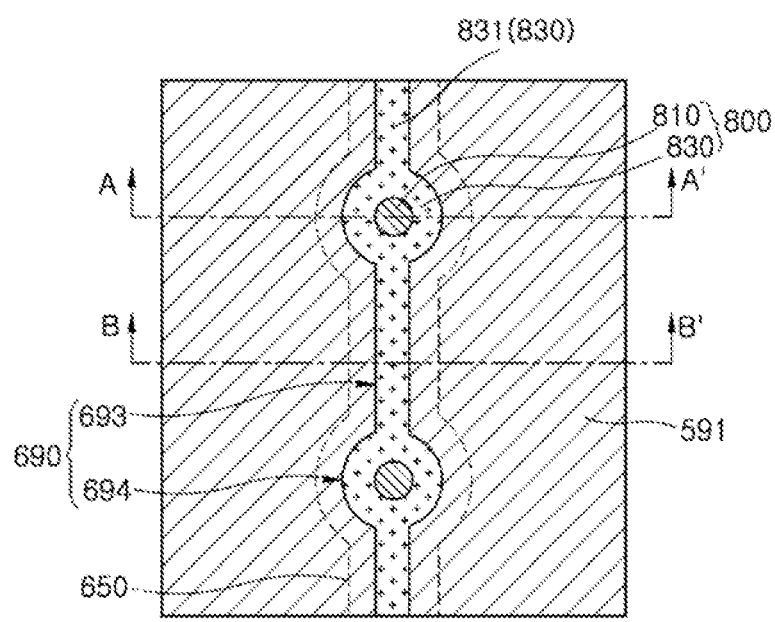
Figure 17:
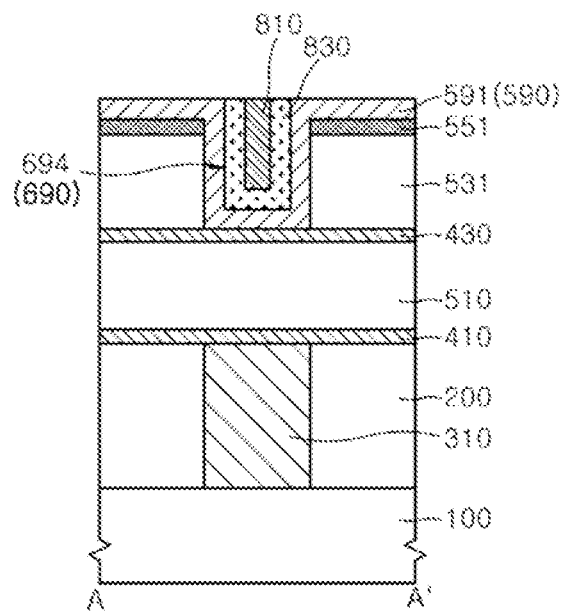
Figure 18:
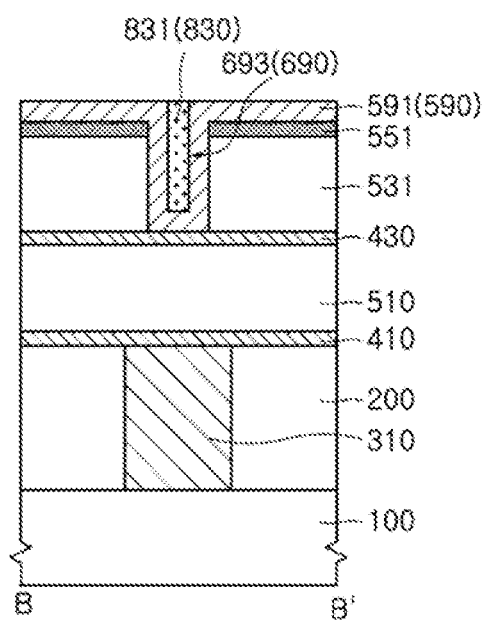

FIGS. 16, 17 and 18 illustrate a step of phase-separating the BCP material 800. FIG. 16 is a plan view illustrating a phase-separated BCP material. FIG. 17 is a cross-sectional view taken along a line A-A' of FIG. 16, and FIG. 18 is a cross-sectional view taken along a line B-B' of FIG. 16.

Referring to FIGS. 16, 17 and 18, the BCP material 800 may be annealed to form a polymer block domain 810 having a circular pillar shape and a polymer block matrix 830 surrounding the polymer block domain 810 to have a cylindrical shape in each of the second nest-shaped recession regions

694. If the BCP material 800 having a homogeneous phase illustrated in FIG. 97 is annealed, the BCP material 800 in each of the second nest-shaped recession regions 694 may be phase-separated into the polymer block domain 810, corresponding to the domain A of FIG. 98, and the polymer block matrix 830, corresponding to the domain B of FIG. 98. The polymer block domain 810 may be formed of first polymer blocks, for example, PMMA polymer blocks, in the BCP material 800, and the polymer block matrix 830 may be formed of second polymer blocks, for example, PS polymer blocks, in the BCP material 800. In some embodiments of the present invention, the annealing process may be a thermal annealing process that is performed at a temperature of about 200 degrees to about 300 degrees for about one hour to about one hundred hours. That is, if the BCP material 800 is thermally annealed, first polymer blocks and second polymer blocks constituting the BCP material 800 in each of the second nest-shaped recession regions 694 may be reordered to cause phase separation in the BCP material 800.

The polymer block domain 810 may be formed to have a circular pillar shape and may be surrounded by the polymer block matrix 830 having a cylindrical shape. While the BCP material 800 is annealed, phase separation of the BCP material 800 may selectively occur in only the second nest-shaped recession regions 694 and phase separation of the BCP material 800 in the second line-shaped recession region 693 may be suppressed. That is, the second nest-shaped recession region 694 having the sixth width D6 may provide sufficient space for phase separation of the BCP material 800, whereas the second line-shaped recession region 693 having the fifth width D5 does not have sufficient space for phase separation of the BCP material 800. Thus, no polymer block domain 810 may be formed in the second line-shaped recession region 693, and the polymer block domain 810 may be formed only in a central portion of each of the second nest-shaped recession regions 694. As a result, the polymer block domain 810 may be self-aligned with the second nest-shaped recession region 694.

Since the polymer block domain 810 is formed by rearrangement or phase separation, of the first polymer blocks in the BCP material 800, the polymer block matrix 830 may be formed by rearrangement or phase separation, of the second polymer blocks in the BCP material 800. Even though the BCP material 800 is annealed, the BCP material 800 in the second line-shaped recession region 693 does not phase-separate since the second line-shaped recession region 693 provides insufficient space for phase separation of the BCP material 800. As a result, the polymer block matrix 831 remaining in the second line-shaped recession region 693 may have a homogeneous phase. That is, the polymer block matrix 831 remaining in the second line-shaped recession region 693 may include the first polymer blocks and the second polymer blocks, which are randomly arrayed.

Figure 19:
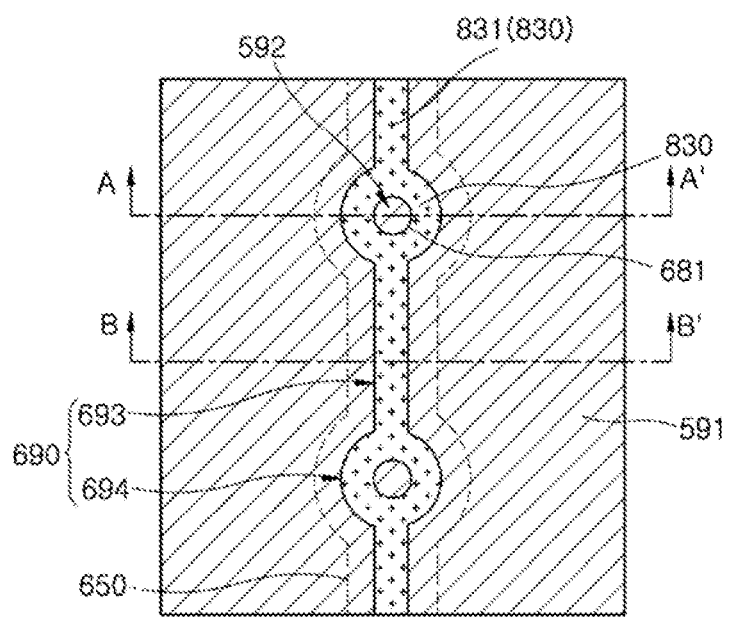
Figure 20:
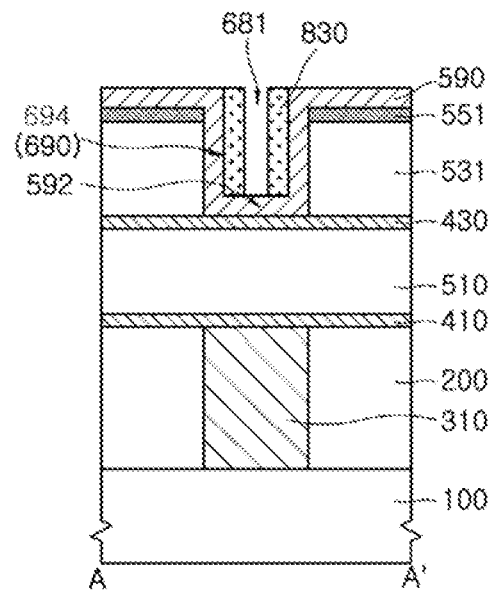
Figure 21:
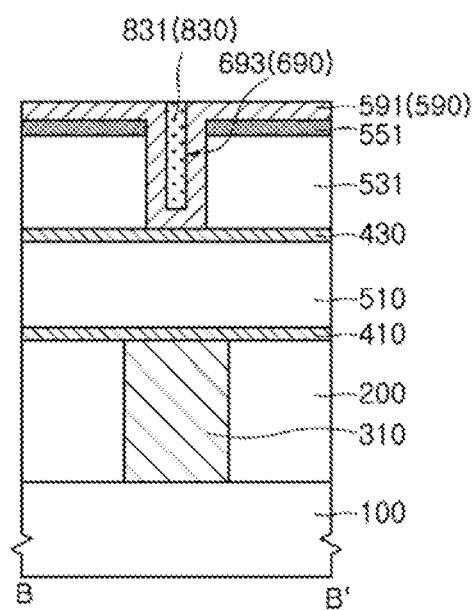

FIGS. 19, 20 and 21 illustrate a step of removing the polymer block domain 810 to form a hole-shaped cavity 681. FIG. 19 is a plan view illustrating the hole-shaped cavity 681. FIG. 20 is a cross-sectional view taken along a line A-A' of FIG. 19, and FIG. 21 is a cross-sectional view taken along a line B-B' of FIG. 19.

Referring to FIGS. 19, 20 and 21, the polymer block domain 810 may be removed to form a hole-shaped cavity 681. The polymer block domain 810, for example, PMMA polymer blocks, may be selectively removed using a wet etch process or a dry etch process. The hole-shaped cavity 681 may be aligned with the second nest-shaped recession region 694 and may be formed in a central portion of the second nest-shaped recession region 694. Subsequently, a bottom portion of the polymer block matrix 830 exposed by the hole-shaped cavity 681 may be selectively etched to expose a bottom portion 592 of the guide spacer layer 590 under the hole-shaped cavity 681. Alternatively, a bottom portion of the polymer block matrix 830 exposed by the hole-shaped cavity 681 may be etched in a subsequent etch process for etching back the guide spacer layer 590.

Figure 22:
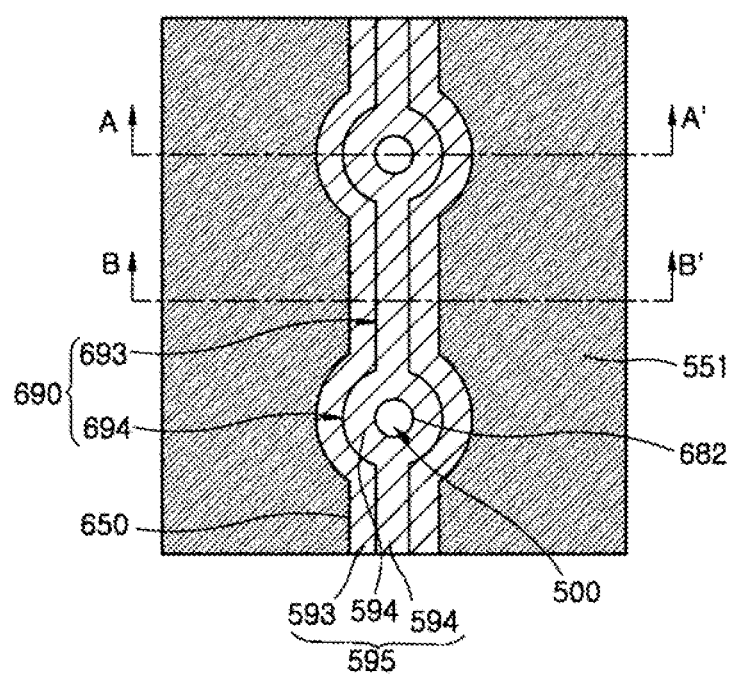
Figure 23:
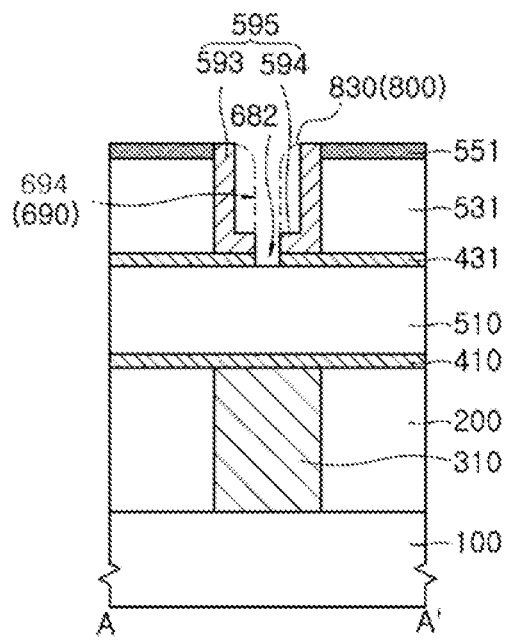
Figure 24:
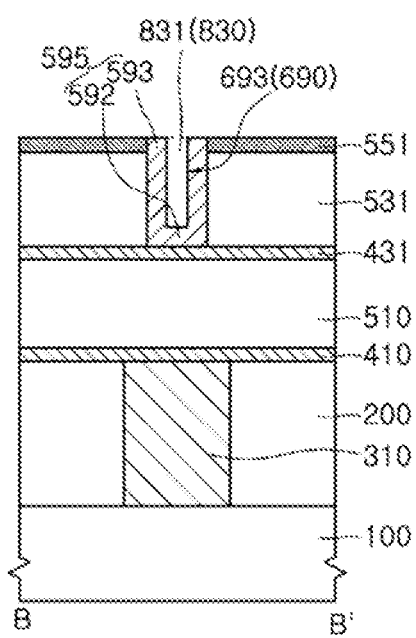

FIGS. 22, 23 and 24 illustrate a step of forming a guide spacer pattern 595. FIG. 22 is a plan view illustrating the guide spacer pattern 595. FIG. 23 is a cross-sectional view taken along a line A-A' of FIG. 22, and FIG. 24 is a cross-sectional view taken along a line B-B' of FIG. 22.

Referring to FIGS. 22, 23 and 24, using the polymer block matrix 830 as an etch mask, the guide spacer layer 590 may be etched to form a first via cavity 682 exposing a portion of the second hard mask layer 430. After the first via cavity 682 is formed, the third hard mask pattern 551 may be exposed. Additionally, after the first via cavity 682 is formed a portion of the guide spacer layer 590 may remain in the first nest-shaped recession region (654 of FIG. 8) and the first line-shaped recession region (653 of FIG. 8). That is, after the first via cavity 682 is formed, a sidewall portion 593 may remain on the sidewalls of the first nest-shaped recession region 654 and the first line-shaped recession region 653, a first bottom portion 594 defining the first via cavity 682 may remain on a bottom surface of the first nest-shaped recession region 654, and a second bottom portion 592 may remain on a bottom surface of the first line-shaped recession region 653. The sidewall portion 593, the first bottom portion 594 and the second bottom portion 592 may constitute the guide spacer pattern 595.

Subsequently, using the guide spacer pattern 595 as an etch mask, the second hard mask layer 430 exposed by the first via cavity 682 may be etched to form a second hard mask pattern 431 exposing the first dielectric layer 510 under the first via cavity 682. While the second hard mask pattern 431 is formed, the second hard mask layer 430 under the second line-shaped recession region 693 is not etched due to the presence of the guide spacer pattern 595. After the second hard mask pattern 431 is formed, the polymer block matrix 830 may be removed.

In some embodiments, the polymer block matrix 830 may be removed after the first via cavity 682 is formed, and the second hard mask pattern 431 may be formed after the polymer block matrix 830 is removed.

Figure 25:
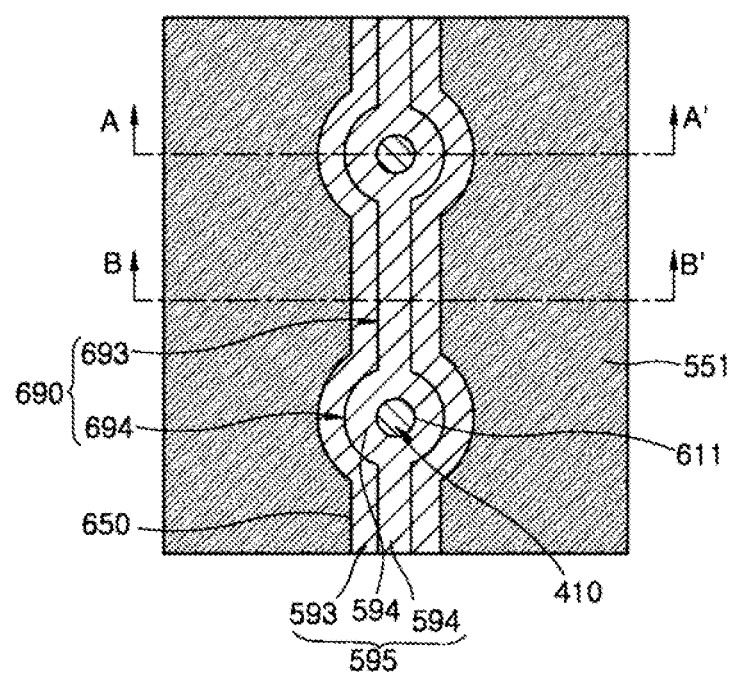
Figure 26:
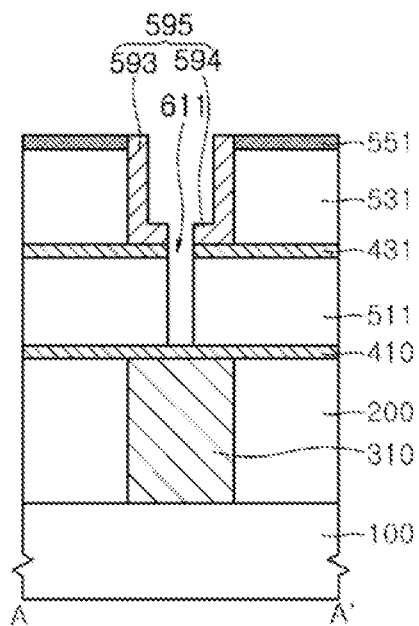
Figure 27:
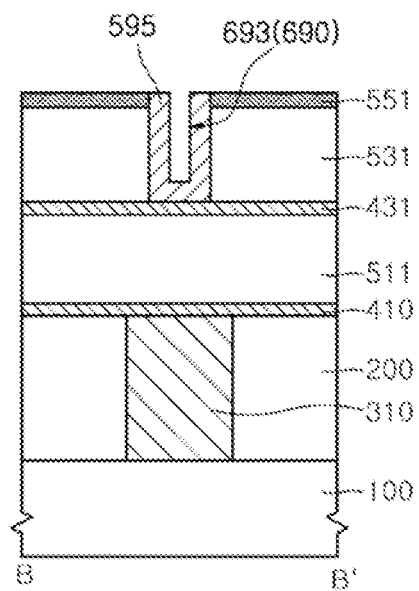

FIGS. 25, 26 and 27 illustrate a step of forming a second via cavity 611. FIG. 25 is a plan view illustrating the second via cavity 611. FIG. 26 is a cross-sectional view taken along a line A-A' of FIG. 25, and FIG. 27 is a cross-sectional view taken along a line B-B' of FIG. 25.

Referring to FIGS. 25, 26 and 27, the first dielectric layer (510 of FIG. 23) exposed by the first via cavity 682 may be etched to form a second via cavity 611 that extends from the first via cavity 682. As a result, a first dielectric pattern 511 defining the second via cavity 611 may be formed. The etch process for forming the second via cavity 611 may be performed using the guide spacer pattern 595 and the third hard mask pattern 551 as etch masks. When the etch process for forming the second via cavity 611 is performed, the first hard mask layer 410 may act as an etch stopper to prevent the lower conductive line 310 and the insulation layer 200 from being damaged. The second via cavity 611 may be aligned with the first via cavity 682. Thus, the second via cavity 611 may be formed in a central portion of the second nest-shaped recession regions 694.

Figure 28:
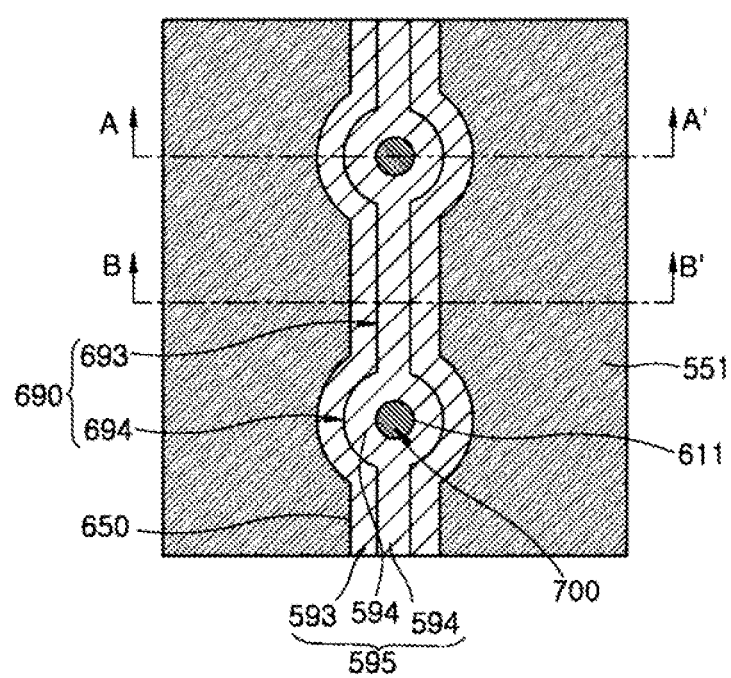
Figure 29:
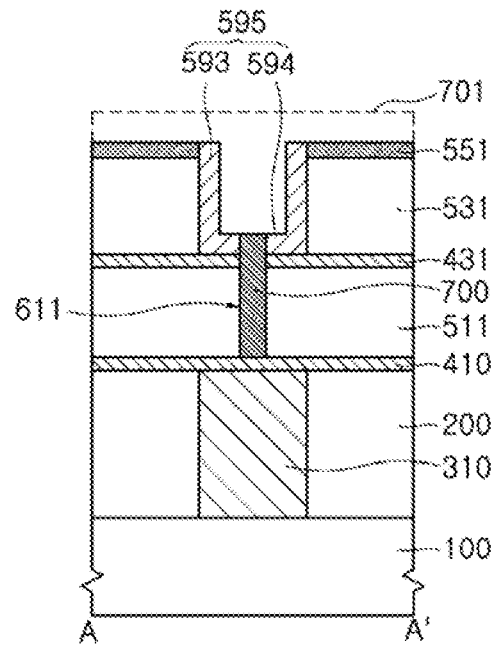
Figure 30:
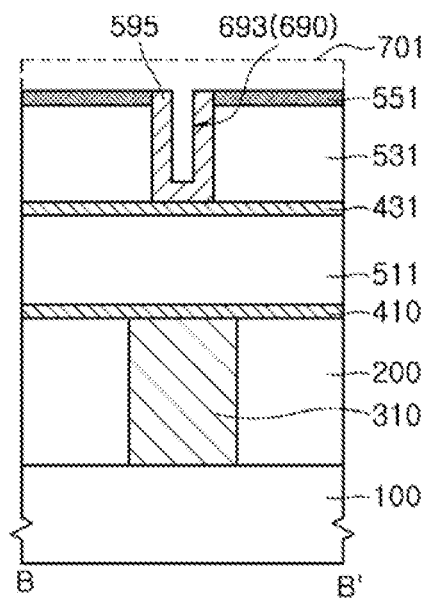

FIGS. 28, 29 and 30 illustrate a step of forming a sacrificial via plug 700. FIG. 28 is a plan view illustrating the sacrificial via plug 700. FIG. 29 is a cross-sectional view taken along a line A-A' of FIG. 28, and FIG. 30 is a cross-sectional view taken along a line B-B' of FIG. 28.

Referring to FIGS. 28, 29 and 30, the sacrificial via plug 700 may be formed in the second via cavity 611. Specifically, a sacrificial layer 701 may be formed on the substrate including the second via cavity 611, and the sacrificial layer 701 may be etched back or recessed to expose a surface of the guide spacer pattern 595 and a surface of the third hard mask pattern 551. As a result, a portion of the sacrificial layer 701 may remain in the second via cavity 611 to form the sacrificial via plug 700. The sacrificial via plug 700 may assist in maintaining the shape of the second via cavity 611 and prevent damage to the first hard mask layer 410 during subsequent etch processes for removing the guide spacer pattern 595. The sacrificial layer 701 may be formed of a material having excellent gap filling characteristics and etch selectivity with respect to the dielectric layers 410, 511, 431, 531 and 551. For example, the sacrificial layer 701 may be formed of a spin-on-carbon (SOC) layer.

Figure 31:
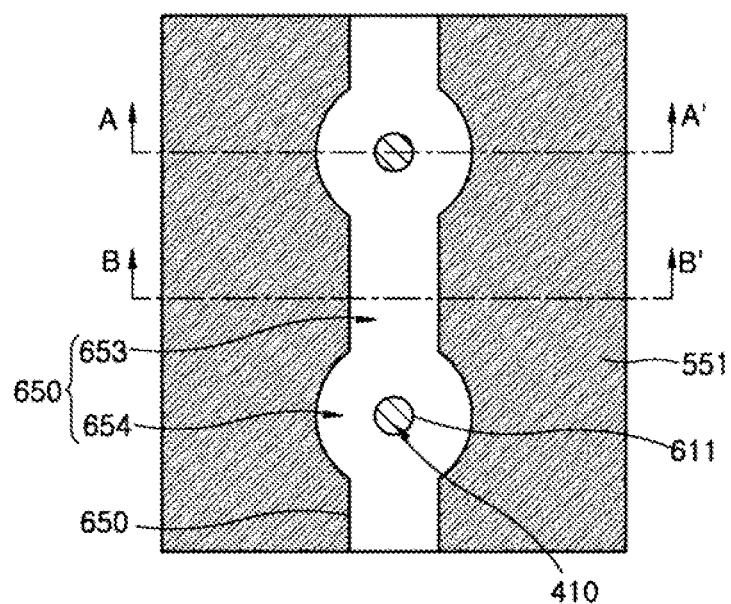
Figure 32:
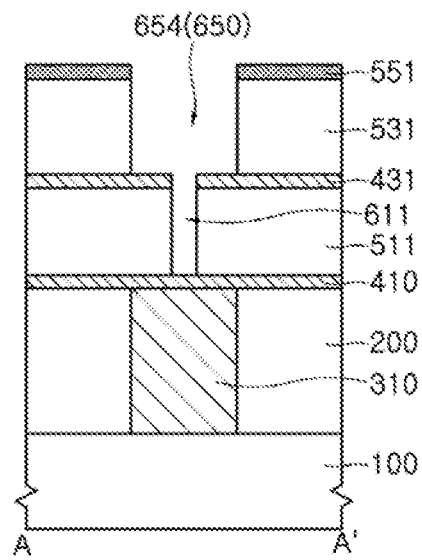
Figure 33:
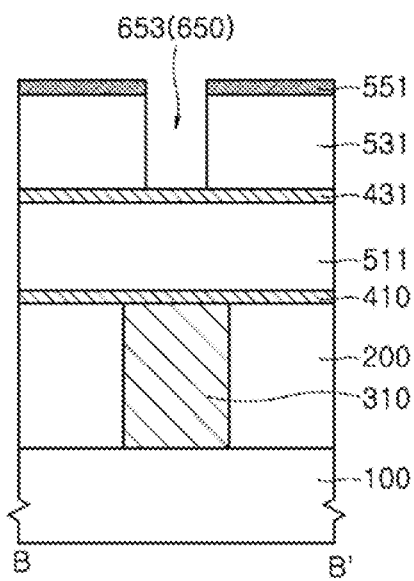

FIGS. 31, 32 and 33 illustrate a step of exposing the first recession region 650 and the second via cavity 611. FIG. 31 is a plan view illustrating the first recession region 650 and the second via cavity 611 after being exposed. FIG. 32 is a cross-sectional view taken along a line A-A' of FIG. 31, and FIG. 33 is a cross-sectional view taken along a line B-B' of FIG. 31.

Referring to FIGS. 31, 32 and 33, the guide spacer pattern 595 may be removed to expose sidewalls and a bottom surface of the first recession region 650 including the first line-shaped recession region 653 and the first nest-shaped recession region 654. Moreover, the sacrificial via plug 700 may be removed to expose a sidewall and a bottom surface of the second via cavity 611. The second via cavity 611 may be aligned with a central portion of the first nest-shaped recession region 654, as illustrated in FIG. 32.

Figure 34:
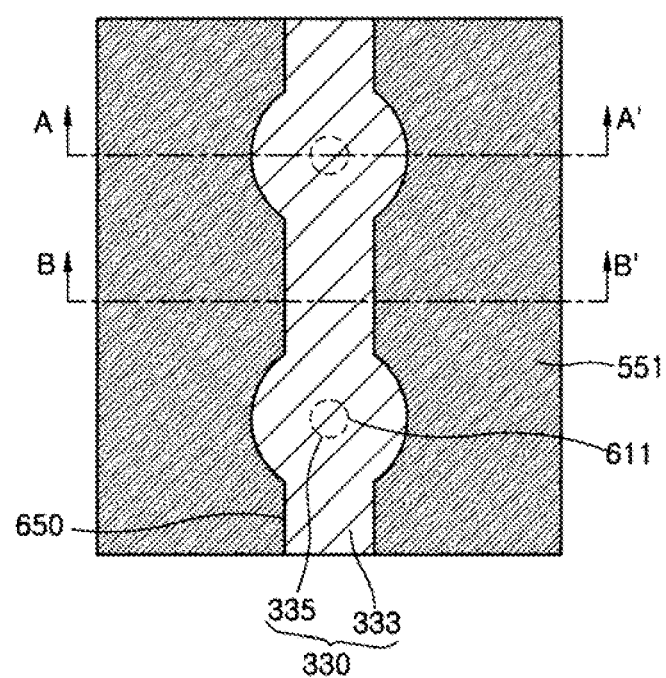
Figure 35:
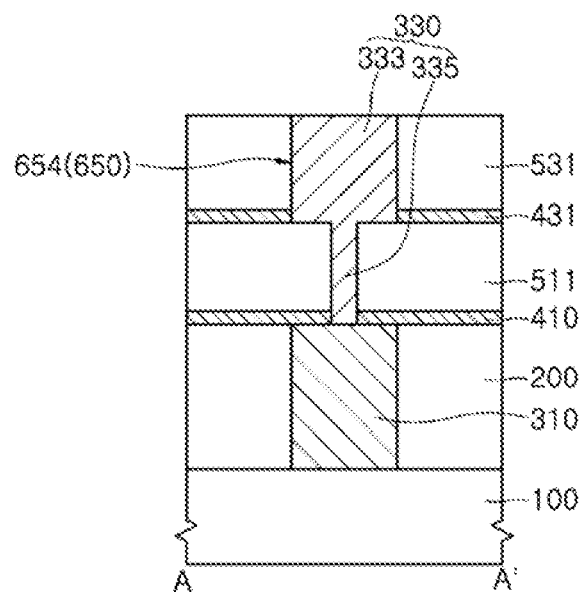
Figure 36:
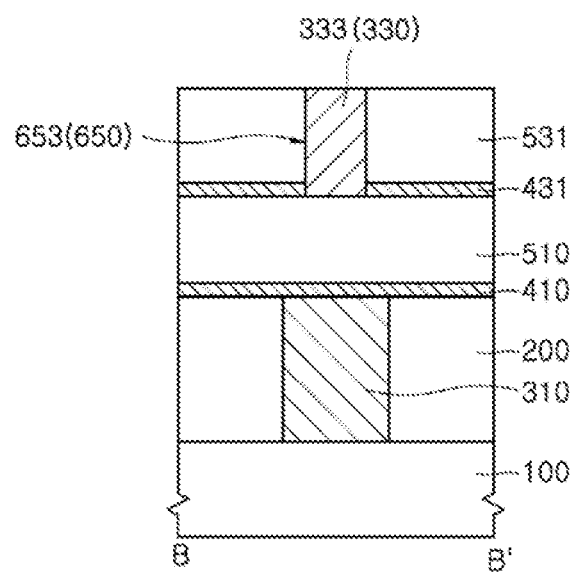

FIGS. 34, 35 and 36 illustrate a step of forming an upper conductive line 333 and a conductive via 335. FIG. 34 is a plan view illustrating the upper conductive line 333 and the conductive via 335. FIG. 35 is a cross-sectional view taken along a line A-A' of FIG. 34, and FIG. 36 is a cross-sectional view taken along a line B-B' of FIG. 34.

Referring to FIGS. 34, 35 and 36, an upper conductive layer (not shown) may be formed on the third hard mask pattern 551 to fill the second via cavity 611 and the first recession region 650. The upper conductive layer may then be planarized to form the upper conductive line 333 in the first recession region 650 and the conductive via 335 in the second via cavity 611. The upper conductive line 333 and the conductive via 335 may constitute an upper conductive pattern 330. The planarization process for forming the upper conductive line 333 and the conductive via 335 may be performed using a chemical mechanical polishing (CMP) process to expose the second dielectric pattern 531. During the planarization process, the third hard mask pattern 551 may be removed. The upper conductive pattern 330 may be formed of a metal material such as a copper (Cu) material, an aluminum (Al) material or a tungsten (W) material.

Before the upper conductive layer is formed, the first hard mask layer 410 exposed by the second via cavity 611 may be etched to expose the lower conductive line 310. During the etch process for exposing the lower conductive line 310, the second hard mask pattern 431 exposed by the first recession region 650 may be removed. Moreover, during the etch process for exposing the lower conductive line 310, the third hard mask pattern 551 may also be removed.

As described above, according to an embodiment, a phase separation technique using a BCP material may be applied to a damascene process scheme to form a conductive via 335 that is aligned with the upper conductive line 333 and only requires a single lithography process step. A guide spacer layer may be formed on sidewalls of the first recession region 650 to cause phase separation of the BCP material in only the first nest-shaped recession region 654. Accordingly, the second via cavity 611 for the conductive via 335 may be aligned with the first nest-shaped recession region 654, whereas no via cavity is formed in the first line-shaped recession region 653.

Figure 37:
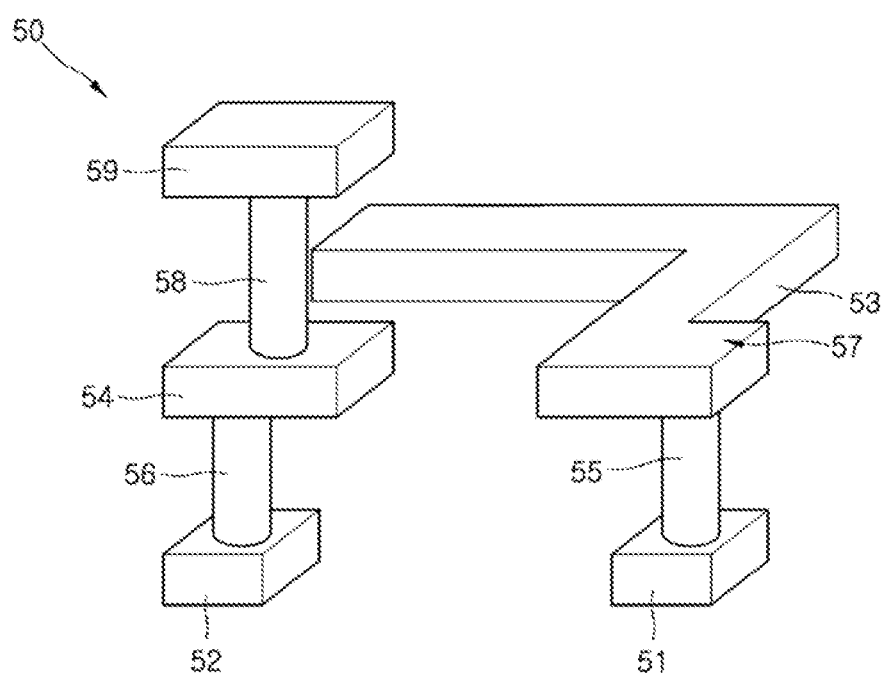
FIG. 37 is a perspective view illustrating an interconnection structure according to another embodiment of the present invention.

FIG. 37 illustrates an interconnection structure 50 according to another embodiment of the present invention.

Referring to FIG. 37, the interconnection structure 50 may include a first lower conductive pattern 51, an upper conductive line 53 located at a higher level than the first lower conductive pattern 51, and a first conductive via 55 electrically connecting the first lower conductive pattern 51 to a connection portion 57 of the upper conductive line 53. The interconnection structure 50 may further include a second lower conductive pattern 52 located at the same level as the first lower conductive pattern 51, a conductive pad 54 located at the same level as the upper conductive line 53, and a second conductive via 56 electrically connecting the second lower conductive pattern 52 to the conductive pad 54. Moreover, the interconnection structure 50 may further include a conductive pad 59, located at a higher level than the conductive pad 54, and a third conductive via 58, electrically connecting the conductive pad 54 to the conductive pad 59. The connection portion 57 of the upper conductive line 53 may correspond to one end of the upper conductive line 53. The first conductive via 55 may be aligned with the connection portion 57 of the upper conductive line 53. The conductive pad 54 may be spaced apart from the upper conductive line 53 and may be an intermediate member that is disposed between the second conductive via 56 and the third conductive via 58.

The first conductive via 55 and the second conductive via 56 may correspond to random conductive vias that are irregularly arrayed. According to the conventional art, an additional photolithography process step is required to form random conductive vias, such as the first conductive via 55 and the second conductive via 56. However, according to the present invention, the first and second conductive vias 55 and 56, which are aligned with connection portion 57 of the upper conductive line 53 and the conductive pad 54, respectively, may be formed using a phase separation technique of a BCP material and a damascene process scheme without any additional photolithography process steps.

Figure 38:
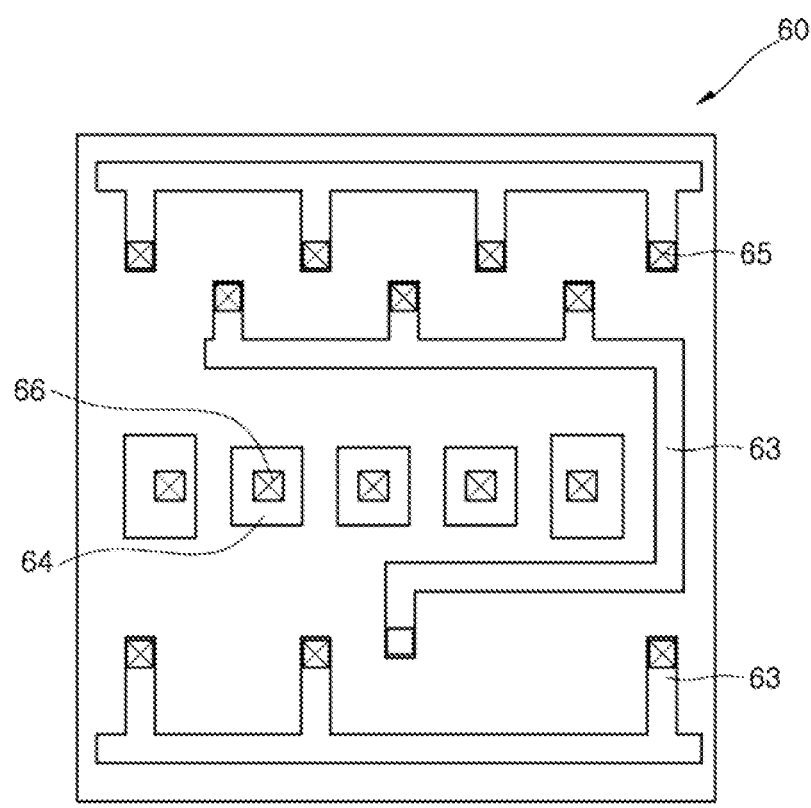
FIGS. 38 and 39 are layout diagrams illustrating interconnection structures according to embodiments of the present invention.
Figure 39:
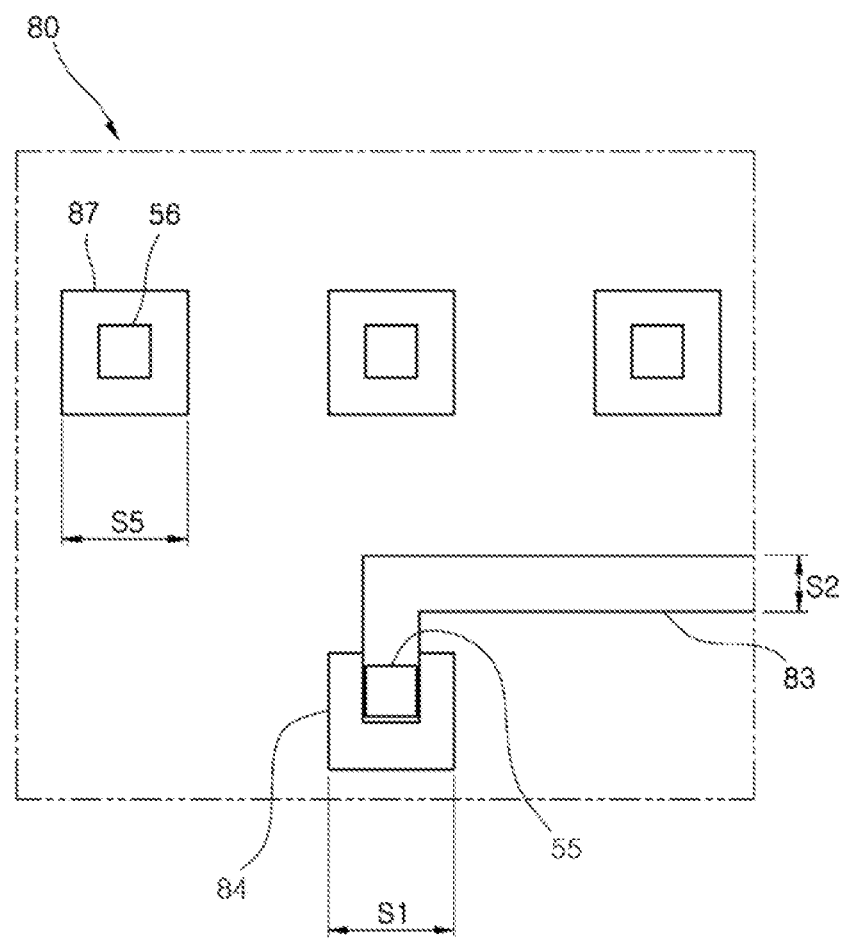

FIG. 38 is a layout diagram 60 illustrating an interconnection structure according to another embodiment of the present invention, and FIG. 39 is a layout diagram 80 illustrating a damascene recession region required to form the interconnection structure having the layout diagram 60 shown in FIG. 38.

Referring to FIG. 38, the layout diagram 60 is a layout for realizing conductive vias 55 and 56, the upper conductive line 53 and the conductive pad 54 illustrated in FIG. 37 using a damascene process. The layout diagram may include an upper conductive line layout 63 for forming the upper conductive line (53 of FIG. 37) and a first conductive via layout 65 for forming the first conductive via (55 of FIG. 37). The layout diagram may further include a conductive pad layout 64 for forming the conductive pad (54 of FIG. 37) and a second conductive via layout 66 for forming the second conductive via (56 of FIG. 37). The layout diagram 60 may be used to generate the layout diagram 80 having the shape of a first recession region which is formed when the interconnection structure (50 of FIG. 37) is realized using a damascene process. That is, the layout diagram 80 may be a first recession layout.

Referring to FIG. 39, the first recession layout 80 may include a first nest-shaped recession layout 84 having a first width S1, a third nest-shaped recession layout 87 having a fifth width S5, and a first line-shaped recession layout 83 having a second width S2. The first nest-shaped recession layout 84 may connect and overlap with one end of the first line-shaped recession layout 83, and the third nest-shaped recession layout 87 may be spaced apart from the first line-shaped recession layout 83. The second width S2 of the first line-shaped recession layout 83 may be less than the first width 51 of the first nest-shaped recession layout 84 and the fifth width S5 of the third nest-shaped recession layout 87. The terms "first width S1", "second width S2" and "fifth width S5" are naming conventions only and, thus, should not be construed as implying that the widths are of increasing size.

Figure 40:
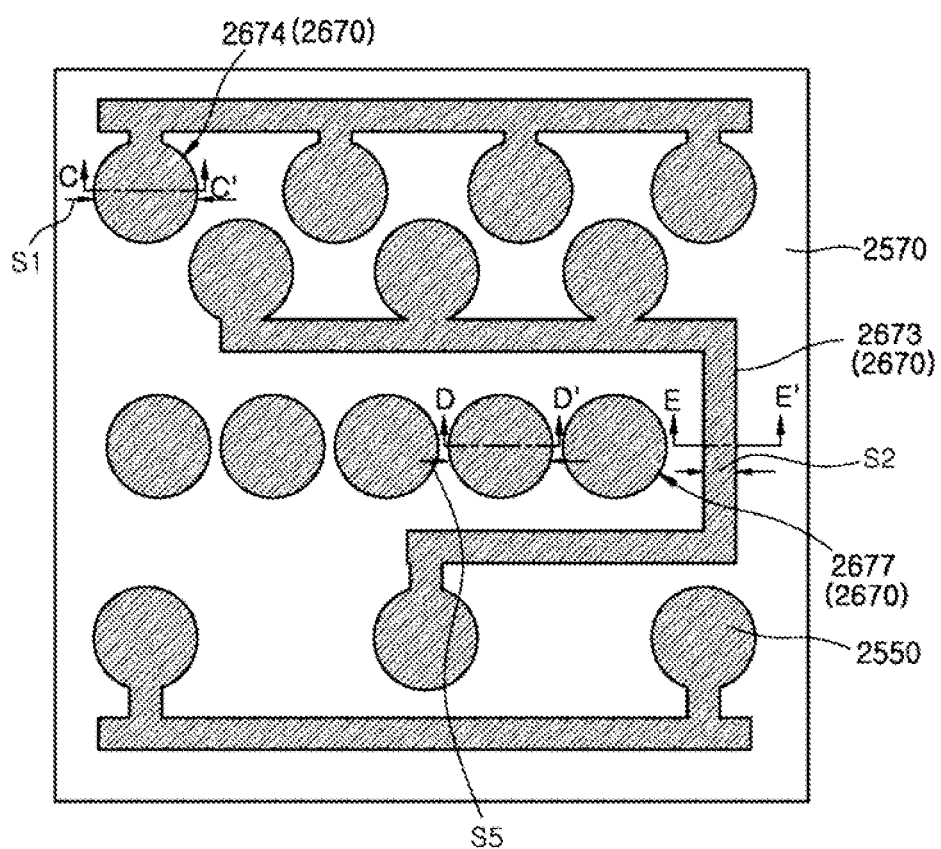
FIGS. 40 to 95 are plan views and cross-sectional views illustrating a method of fabricating an interconnection structure according to another embodiment of the present invention.
Figure 41:
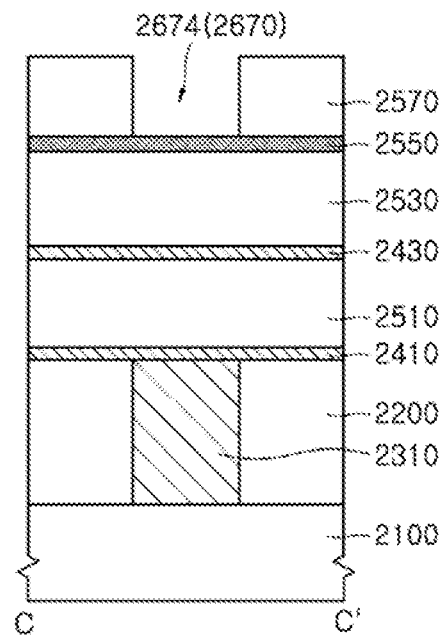
Figure 42:
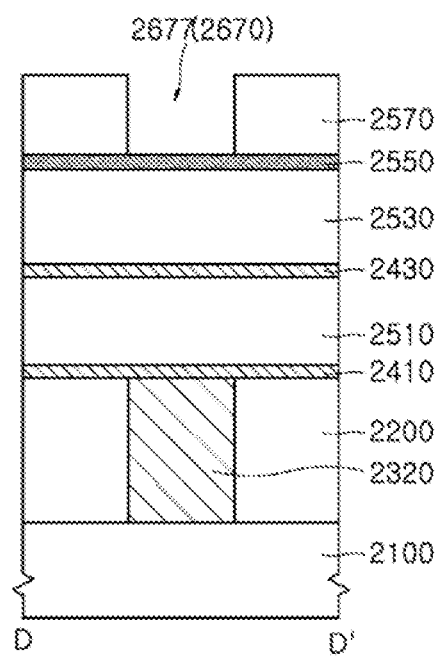
Figure 43:
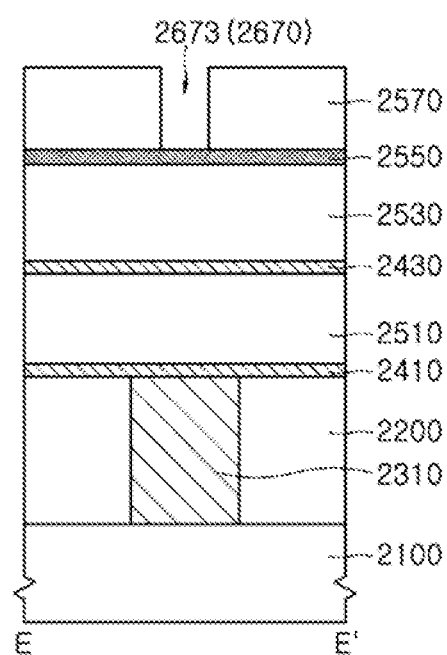

FIGS. 40, 41, 42 and 43 illustrate a step of forming an etch mask 2570. FIG. 40 is a plan view illustrating the etch mask 2570. FIG. 41 is a cross-sectional view taken along a line C-C' of FIG. 40, FIG. 42 is a cross-sectional view taken along a line D-D' of FIG. 40, and FIG. 43 is a cross-sectional view taken along a line E-E' of FIG. 40.

Referring to FIGS. 40, 41, 42 and 43, an insulation layer 2200 may be formed on a semiconductor substrate 2100, and a first lower conductive line 2310 and a second lower conductive line 2320 may be formed in the insulation layer 2200 to be spaced apart from each other. The first lower conductive line 2310 may correspond to the first lower conductive pattern 51 of the interconnection structure 50 shown in FIG. 37. The second lower conductive line 2320 may correspond to the second lower conductive pattern 52 of the interconnection structure 50 shown in FIG. 37. In some embodiments, the first and second lower conductive lines 2310 and 2320 may correspond to a conductive pad or a junction region, for example, a source region or a drain region of a MOS transistor. The first and second lower conductive lines 2310 and 2320 may be formed of a metal material. The insulation layer 2200 may be formed to include a dielectric layer such as a silicon oxide ($SiO_2$) layer.

A dielectric structure including a plurality of dielectric layers 2410, 2510, 2430, 2530 and 2550 may be formed on the lower conductive lines 2310 and 2320 and the insulation layer 2200. Although FIGS. 41, 42 and 43 illustrate an example in which the dielectric structure includes dielectric layers 2410, 2510, 2430, 2530 and 2550 that are sequentially stacked, the inventive concept is not limited thereto. For example, in some embodiments of the present invention, the dielectric structure may be formed using a single dielectric layer. The dielectric layer 2410 may be formed on the lower conductive lines 2310 and 2320 and the insulation layer 2200 to act as a first hard mask layer, and the dielectric layer 2510 may be formed on the first hard mask layer 2410 to act as a first dielectric layer. The dielectric layer 2430 may be formed on the first dielectric layer 2510 to act as a second hard mask layer, and the dielectric layer 2530 may be formed on the second hard mask layer 2430 to act as a second dielectric layer. The first hard mask layer 2410 and the second hard mask layer 2430 may function as etch stoppers. That is, the first hard mask layer 2410 may be formed of a material layer having an etch selectivity with respect to the first dielectric layer 2510, and the second hard mask layer 2430 may be formed of a material layer having an etch selectivity with respect to the second dielectric layer 2530. In some embodiments of the present invention, the first and second hard mask layers 2410 and 2430 may be formed of a silicon nitride ($Si_3N_4$) layer. The first and second dielectric layers 2510 and 2530 may be formed of substantially the same dielectric material. Alternatively, the first dielectric layer 2510 may be formed of a different dielectric material than the second dielectric layer 2530. The dielectric layer 2550, acting as a third hard mask layer, may be formed on the second dielectric layer 2530. The third hard mask layer 2550 may include a material layer having an etch selectivity with respect to the second dielectric layer 2530. For example, the third hard mask layer 2550 may be formed of a silicon nitride layer.

The etch mask 2570 may be formed on the dielectric structure (2410+2510+2430+2530+2550). Specifically, a photoresist layer may be formed on the third hard mask layer 2550, and the photoresist layer may be exposed by an exposure step of a photolithography process with a photo mask having the first recession layout 80 shown in FIG. 39. Subsequently, the exposed photoresist layer may be developed to form the etch mask 2570 including an opening 2670 therein. Accordingly, the shape of the opening 2670 may be determined by the first recession layout 80. During the exposure step and the development step of the photolithography process, corner portions of the first and third nest-shaped recession layouts 84 and 87 of the first recession layout 80 may be changed to have a rounded shape. Thus, a first opening 2674 corresponding to the first nest-shaped recession layout 84 may have a circular shape, and a third opening 2677 corresponding to the third nest-shaped recession layout 87 may also have a circular shape. During the exposure step and the development step of the photolithography process, the first line-shaped recession layout 83 of the first recession layout 80 may be transferred onto the photoresist layer to form a second opening 2673.

Figure 44:
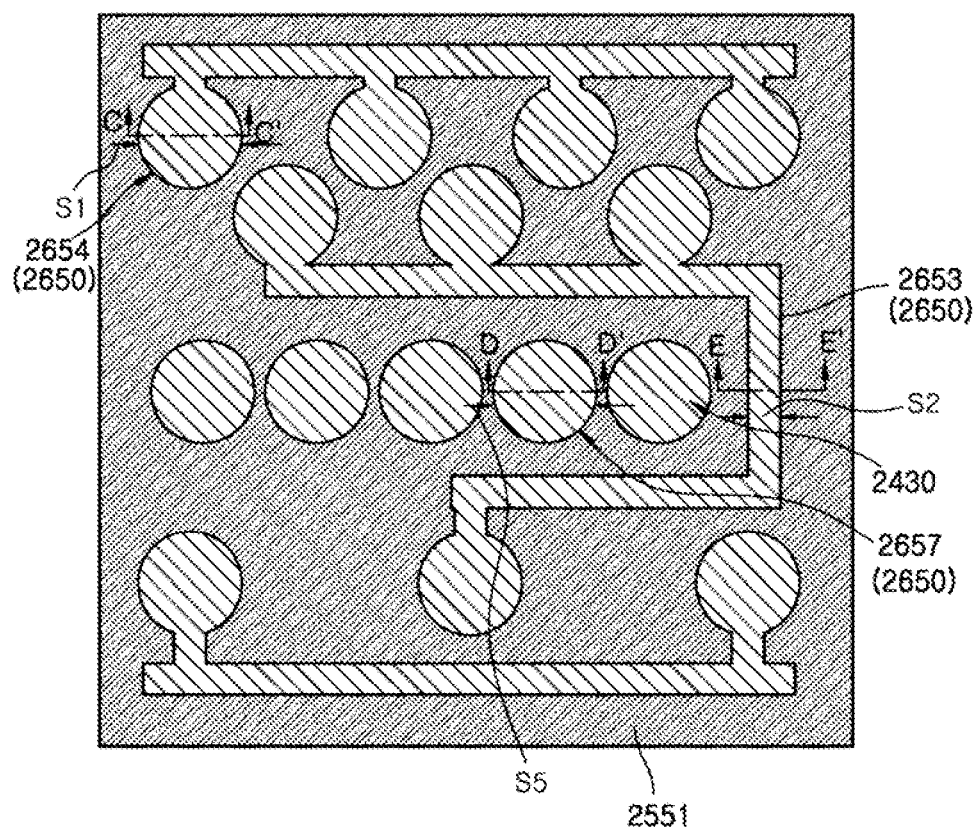
Figure 45:
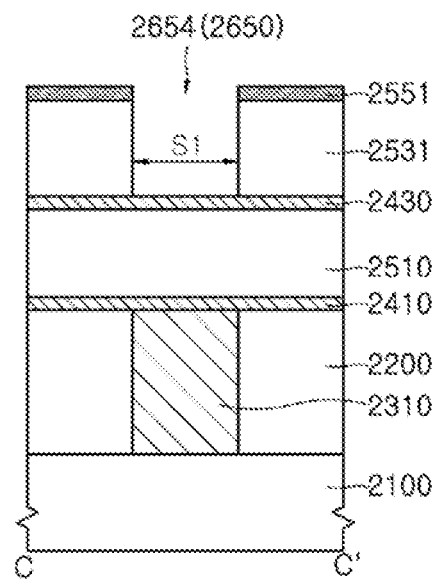
Figure 46:
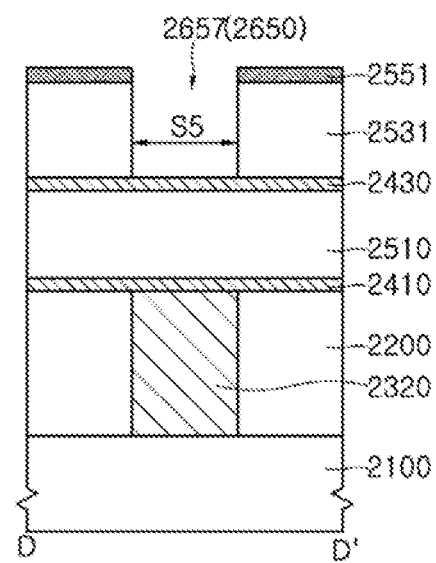
Figure 47:
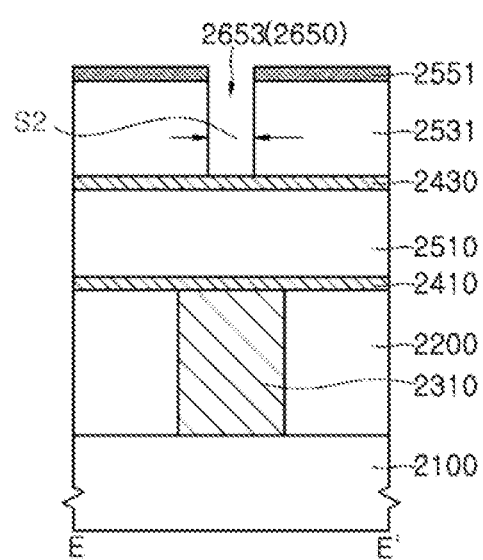

FIGS. 44, 45, 46 and 47 illustrate a step of forming a first recession region 2650. FIG. 44 is a plan view illustrating the first recession region 2650. FIG. 45 is a cross-sectional view taken along a line C-C' of FIG. 44, FIG. 46 is a cross-sectional view taken along a line D-D' of FIG. 44, and FIG. 47 is a cross-sectional view taken along a line E-E' of FIG. 44.

Referring to FIGS. 44, 45, 46 and 47, the third hard mask layer 2550 exposed by the etch mask 2570 may be selectively etched to form a third hard mask pattern 2551, and the second dielectric layer 2530 exposed by the third hard mask pattern 2551 may be selectively etched to form a second dielectric pattern 2531.

As a result of the selective etch process, the opening (2670 of FIGS. 41, 42 and 43) of the etch mask 2570 may be transferred into the second dielectric layer 2530 to form a first recession region 2650 including a first nest-shaped recession region 2654 having substantially the first width S1, a third nest-shaped recession region 2657 having substantially the fifth width S5, and a first line-shaped recession region 2653 having approximately the second width S2, which is less than the first and fifth widths S1 and S5. While the selective etch process is performed to form the first recession region 2650, the second hard mask layer 2430 may act as an etch stopper. Thus, the first nest-shaped recession region 2654, the third nest-shaped recession region 2657 and the first line-shaped recession region 2653 may have substantially the same depth.

Figure 48:
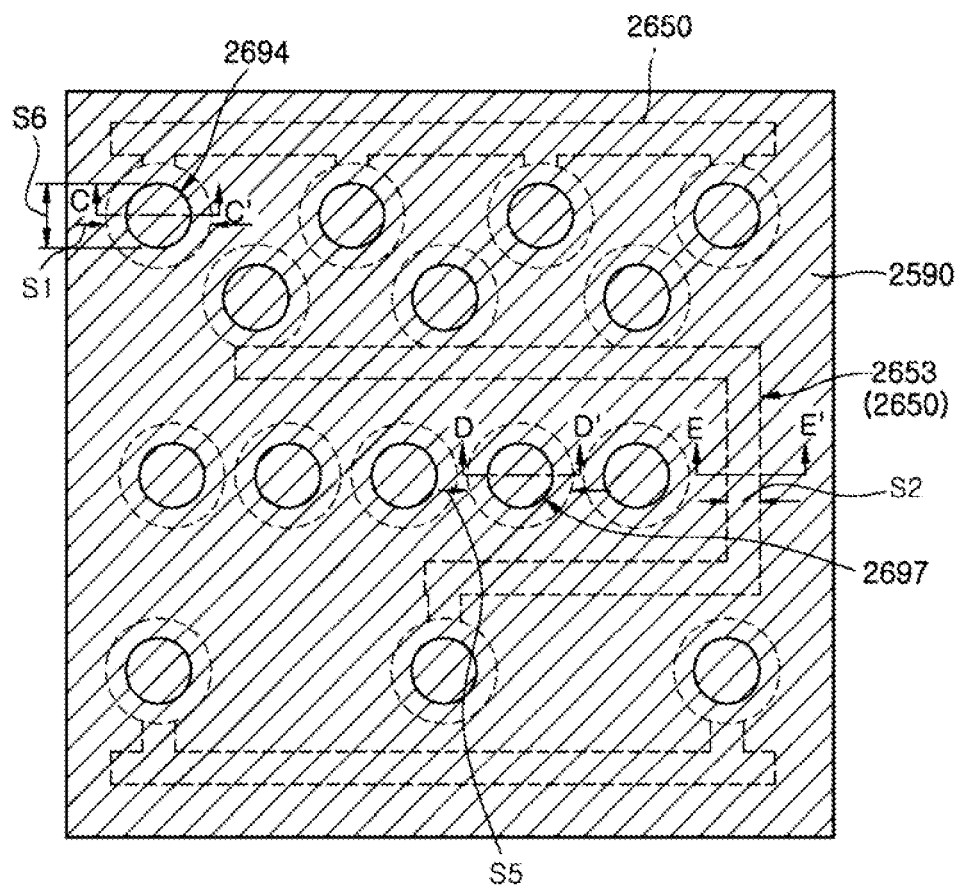
Figure 49:
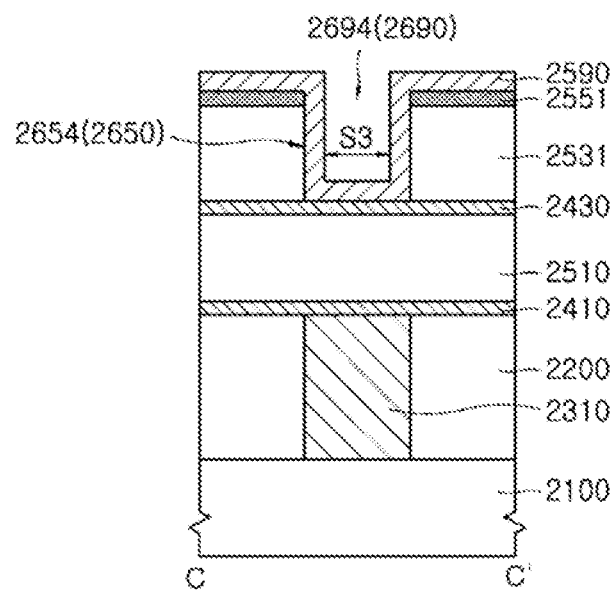
Figure 50:
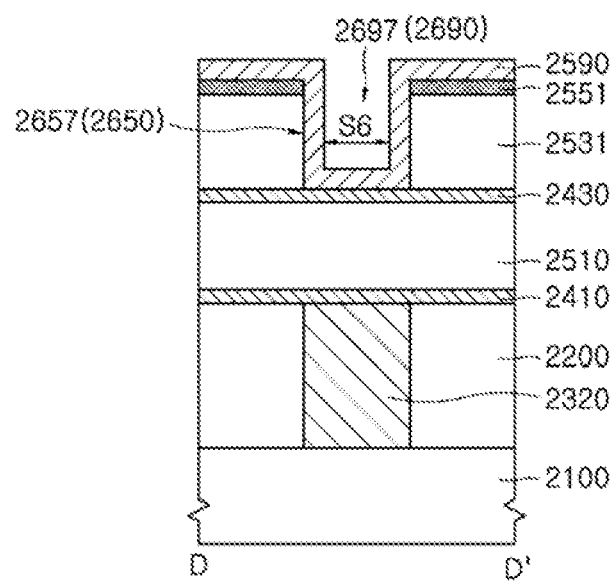
Figure 51:
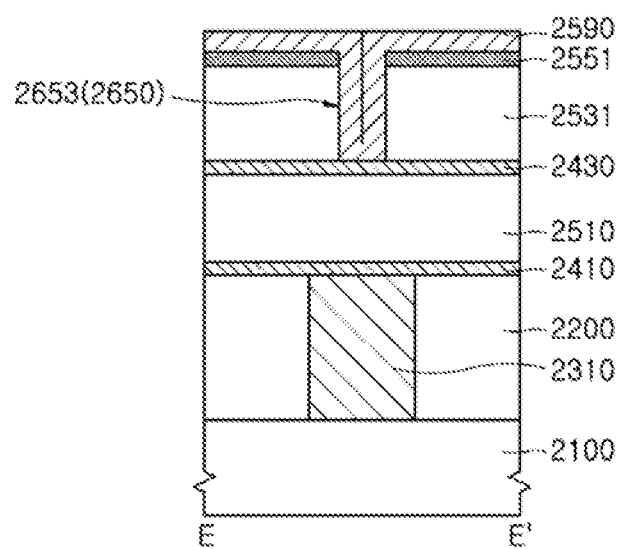

FIGS. 48, 49, 50 and 51 illustrate a step of forming a guide spacer layer 2590. FIG. 48 is a plan view illustrating the guide spacer layer 2590. FIG. 49 is a cross-sectional view taken along a line C-C' of FIG. 48, FIG. 50 is a cross-sectional view taken along a line D-D' of FIG. 48, and FIG. 51 is a cross-sectional view taken along a line E-E' of FIG. 48.

Referring to FIGS. 48, 49, 50 and 51, the guide spacer layer 2590 may be formed on the third hard mask pattern 2551 to conformably cover sidewalls and a bottom surface of the first recession region 2650. The guide spacer layer 2590 may be formed to include a material layer having an etch selectivity with respect to the second dielectric pattern 2531. The guide spacer layer 2590 may include a metal nitride layer such as a titanium nitride (TiN) layer or a silicon layer such as a polysilicon layer. Since the guide spacer layer 2590 is formed to cover the sidewalls of the first recession region 2650, the actual width of the first recession region 2650 may be reduced due to the presence of the guide spacer layer 2590. Accordingly, the guide spacer layer 2590 may be formed to provide a second recession region 2690 including a second nest-shaped recession region 2694 having a third width S3, which is less than the first width S1, and a fourth nest-shaped recession region 2697 having a sixth width S6, which is less than the fifth width S5. Meanwhile, the guide spacer layer 2590 may be formed to completely fill the first line-shaped recession region 2653. Thus, after the guide spacer layer 2590 is formed, no recession region may remain in the first line-shaped recession region 2653. Accordingly, when a BCP material is formed in the second and fourth nest-shaped recession regions 2694 and 2697 in a subsequent process, no BCP material may be formed in the first line-shaped recession region 2653. As a result, phase separation of the BCP material may occur only in the second and fourth nest-shaped recession regions 2694 and 2697.

Figure 52:
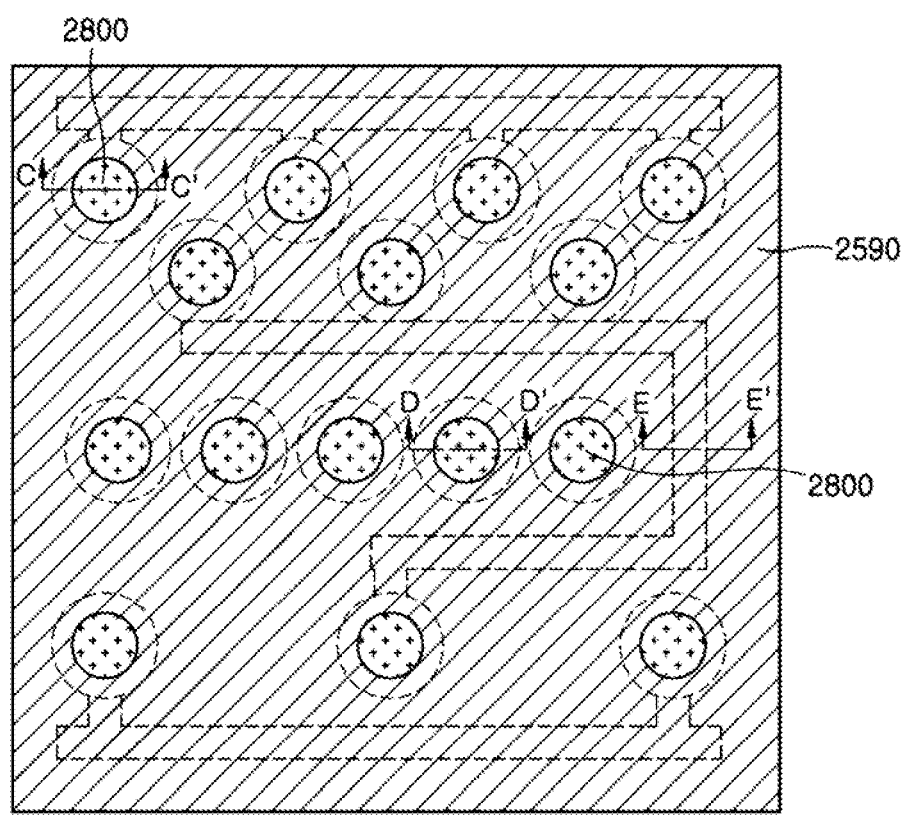
Figure 53:
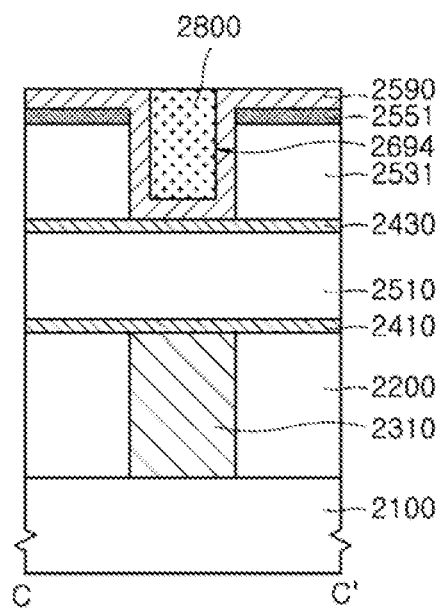
Figure 54:
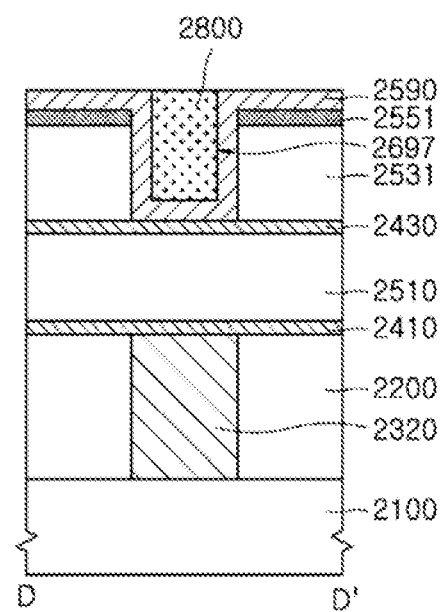
Figure 55:
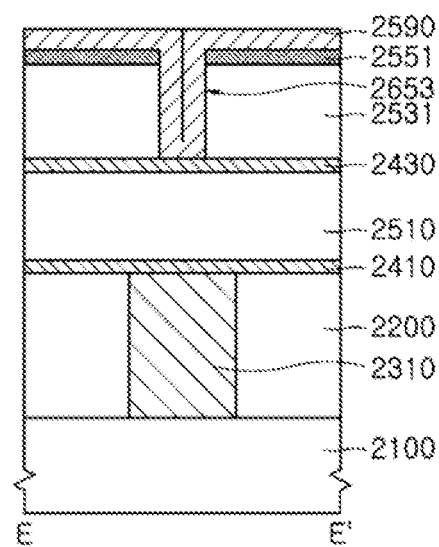

FIGS. 52, 53, 54 and 55 illustrate a step of forming a BCP material 2800. FIG. 52 is a plan view illustrating the BCP material 2800, FIG. 53 is a cross-sectional view taken along a line C-C' of FIG. 52, FIG. 54 is a cross-sectional view taken along a line D-D' of FIG. 52, and FIG. 55 is a cross-sectional view taken along a line E-E' of FIG. 52.

Referring to FIGS. 52, 53, 54 and 55, the BCP material 2800 may be coated to fill the second recession region 2690. The BCP material 2800 may be formed to fill only the second and fourth nest-shaped recession regions 2694 and 2697 since the first line-shaped recession region 2653 is completely filled with guide spacer layer 2590.

Figure 56:
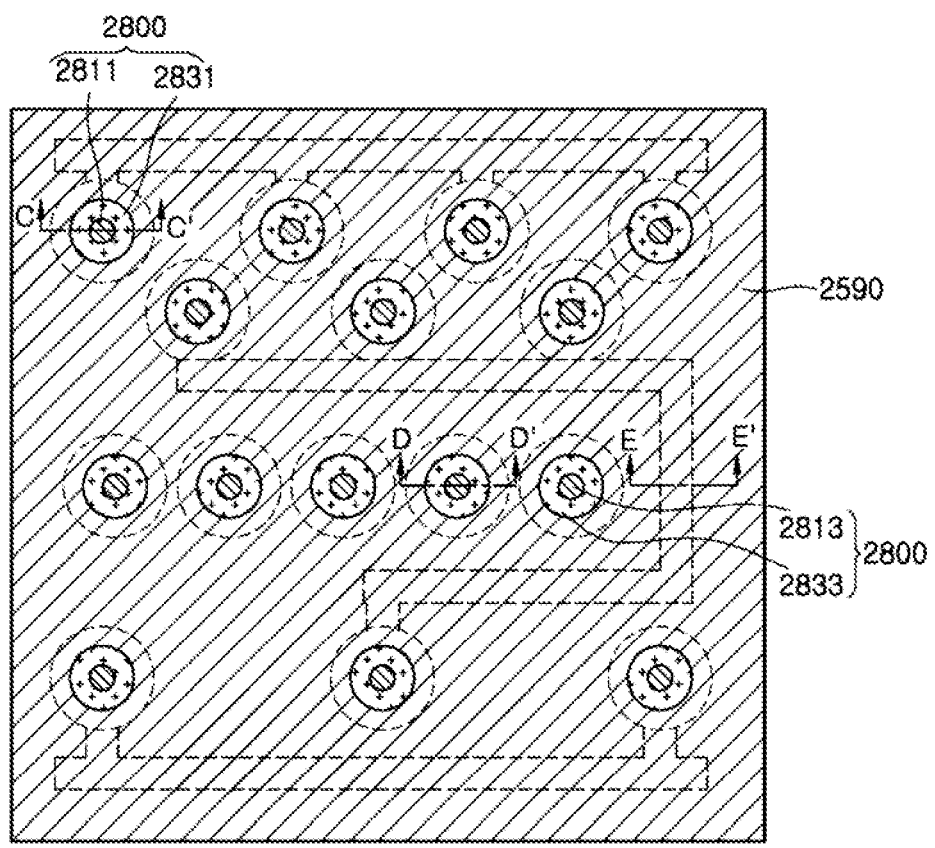
Figure 57:
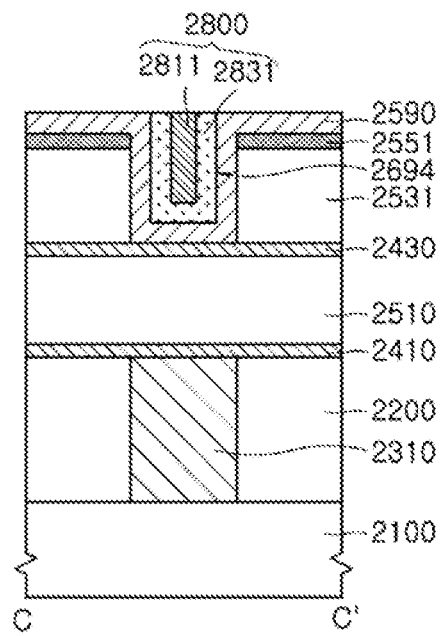
Figure 58:
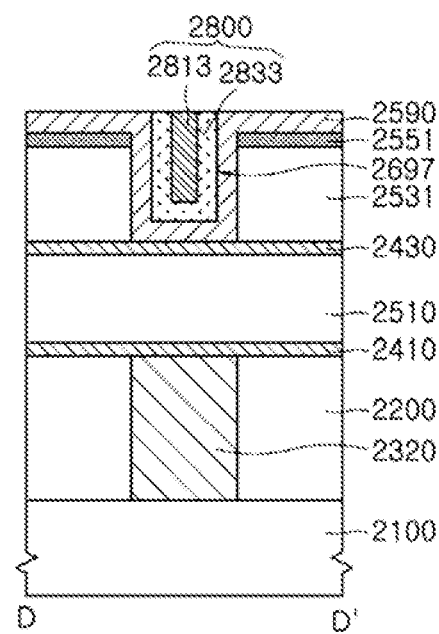
Figure 59:
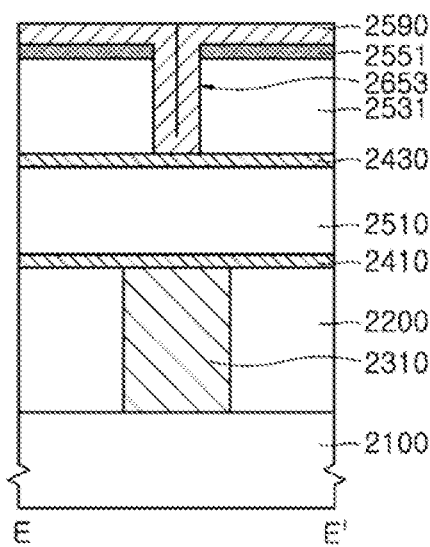

FIGS. 56, 57, 58 and 59 illustrate a step of phase-separating the BCP material 2800. FIG. 56 is a plan view illustrating a phase-separated BCP material. FIG. 57 is a cross-sectional view taken along a line C-C' of FIG. 56, FIG. 58 is a cross-sectional view taken along a line D-D' of FIG. 56, and FIG. 59 is a cross-sectional view taken along a line E-E' of FIG. 56.

Referring to FIGS. 56, 57, 58 and 59, the BCP material 2800 may be annealed to form first and second polymer block domains 2811 and 2813 having circular pillar shapes, and first and second polymer block matrixes 2831 and 2833 having cylindrical shapes. While the BCP material 2800 is annealed, the BCP material 2800 may separate phases to form the first and second polymer block domains 2811 and 2813 and the first and second polymer block matrixes 2831 and 2833. The first polymer block matrix 2831 may be formed to surround the first polymer block domain 2811 in the second nest-shaped recession region 2694, and the second polymer block matrix 2833 may be formed to surround the second polymer block domain 2813 in the fourth nest-shaped recession region 2697. The first and second polymer block domains 2811 and 2813 may be formed to have substantially the same width, that is, the same diameter.

The polymer block domains 2811 and 2813 may be formed of first polymer blocks, for example, PMMA polymer blocks, in the BCP material 2800, and the polymer block matrixes 2831 and 2833 may be formed of second polymer blocks, for example, PS polymer blocks, in the BCP material 2800.

Figure 60:
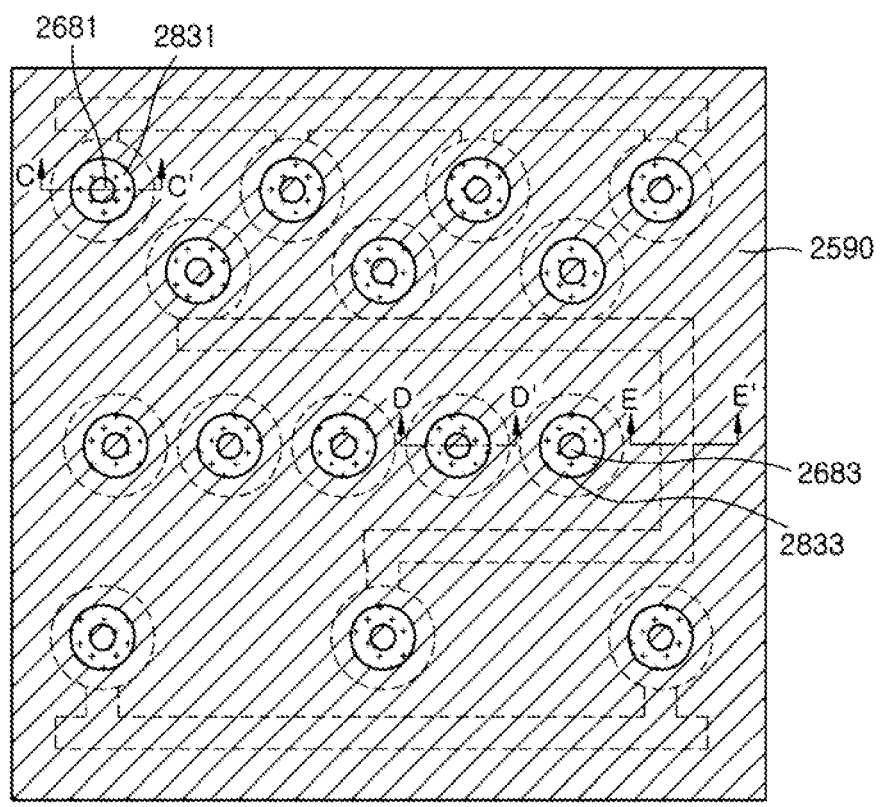
Figure 61:
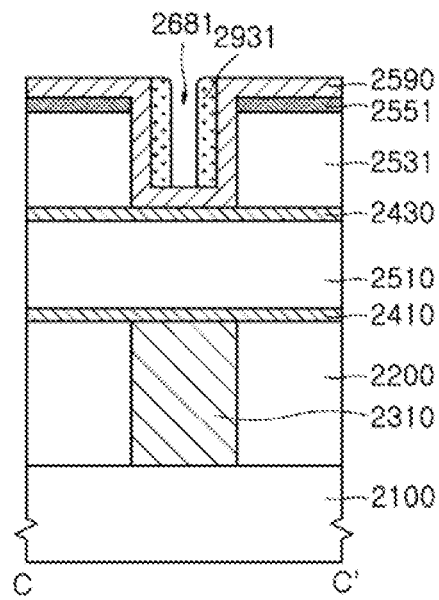
Figure 62:
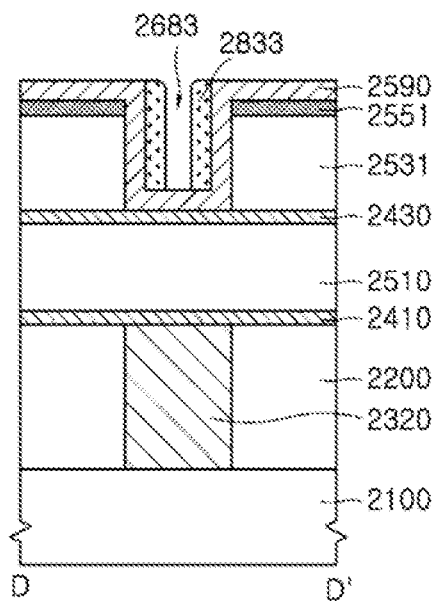
Figure 63:
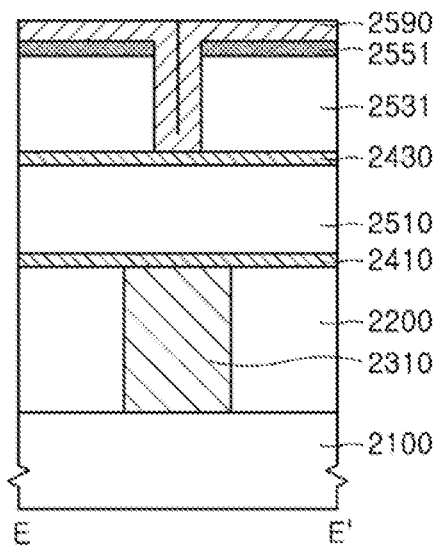

FIGS. 60, 61, 62 and 63 illustrate a step of removing the polymer block domains 2811 and 2813 to form first and second hole-shaped cavities 2681 and 2683. FIG. 60 is a plan view illustrating the first and second hole-shaped cavities 2681 and 2683. FIG. 61 is a cross-sectional view taken along a line C-C' of FIG. 60, FIG. 62 is a cross-sectional view taken along a line D-D' of FIG. 60, and FIG. 63 is a cross-sectional view taken along a line E-E' of FIG. 60.

Referring to FIGS. 60, 61, 62 and 63, the polymer block domains 2811 and 2813 (Shown in FIGS. 57 and 58) may be removed to form the first hole-shaped cavity 2681 and the second hole-shaped cavity 2683 which are aligned with the second nest-shaped recession region 2694 (shown in FIG. 57) and the fourth nest-shaped recession region 2697 (shown in FIG. 58), respectively. The polymer block domains 2811 and 2813 may be removed using a dry etch process or a wet etch process. Subsequently, bottom portions of the polymer block matrixes 2831 and 2833 exposed by the hole-shaped cavities 2681 and 2683 may be selectively etched to expose portions of the guide spacer layer 2590 under the hole-shaped cavities 2681 and 2683.

Figure 64:
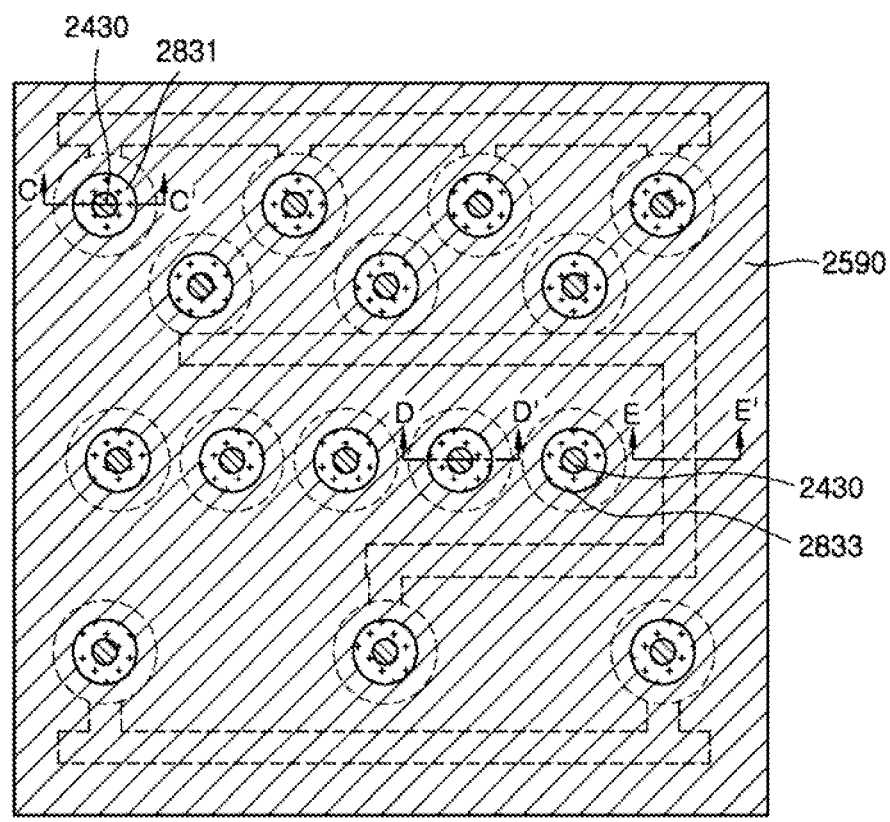
Figure 65:
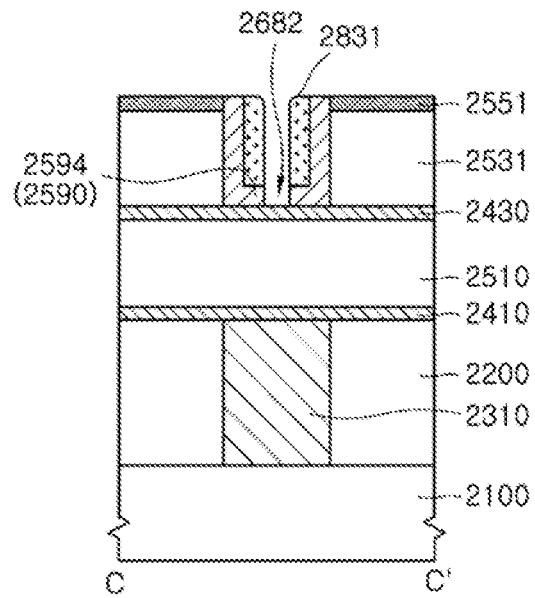
Figure 66:
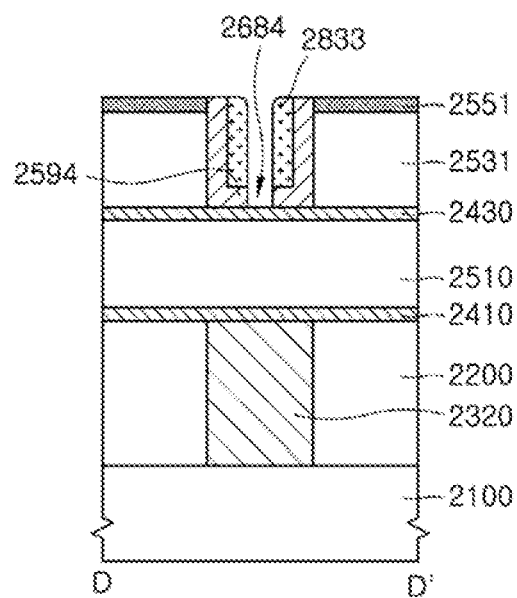
Figure 67:
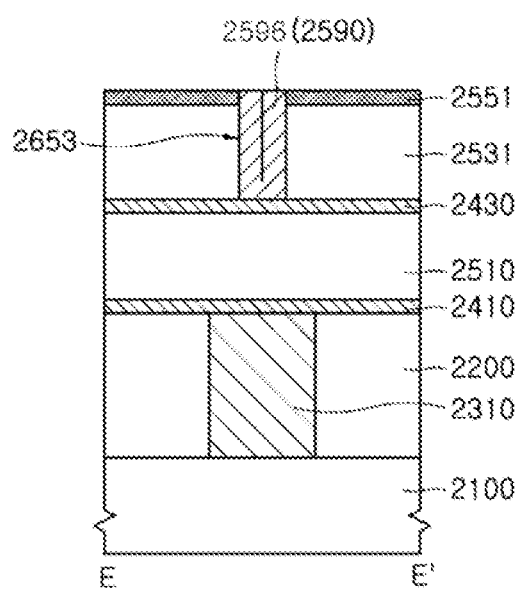

FIGS. 64, 65, 66 and 67 illustrate a step of forming first and third via cavities 2682 and 2684. FIG. 64 is a plan view illustrating the first and third via cavities 2682 and 2684. FIG. 65 is a cross-sectional view taken along a line C-C' of FIG. 64, FIG. 66 is a cross-sectional view taken along a line D-D' of FIG. 64, and FIG. 67 is a cross-sectional view taken along a line E-E' of FIG. 64.

Referring to FIGS. 64, 65, 66 and 67, using the polymer block matrixes 2831 and 2833 as etch masks, the guide spacer layer 2590 may be etched to form a first via cavity 2682 aligned with the first hole-shaped cavity (2681 of FIG. 61) and a third via cavity 2684 aligned with the second hole-shaped cavity (2683 of FIG. 62). After the first and third via cavities 2682 and 2684 are formed, the third hard mask pattern 2551 may be exposed. The guide spacer layer 2590 defining the first and third via cavities 2682 and 2684 may act as an etch mask or a hard mask in a subsequent etch process.

While the first and third via cavities 2682 and 2684 are formed, a portion 2596 of the guide spacer layer 2590 filling the first line-shaped recession region 2653 may prevent the second hard mask layer 2430 under the first line-shaped recession region 2653 from being damaged or etched. Bottom portions 2594 of the guide spacer layer 2590 may remain in the second and fourth nest-shaped recession regions 2694 and 2697 to define the first and third via cavities 2682 and 2684.

Figure 68:
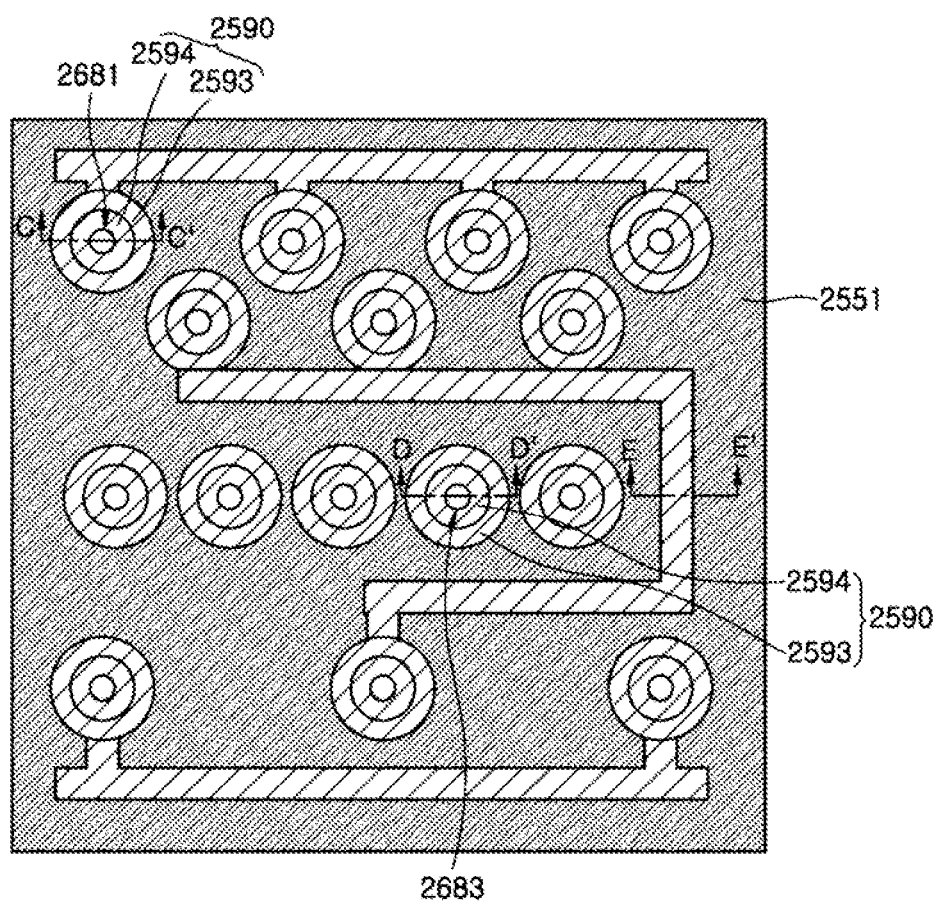
Figure 69:
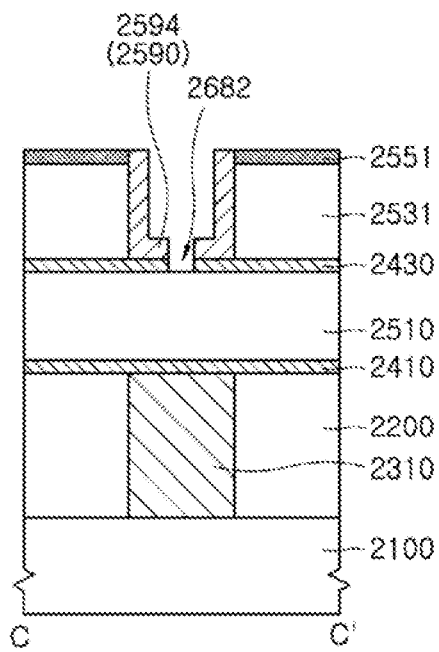
Figure 70:
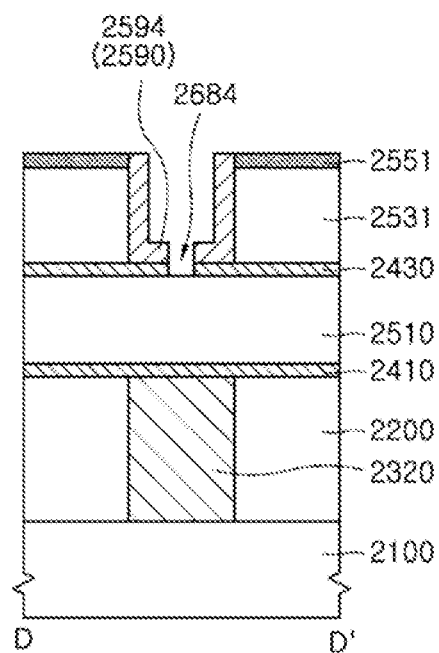
Figure 71:
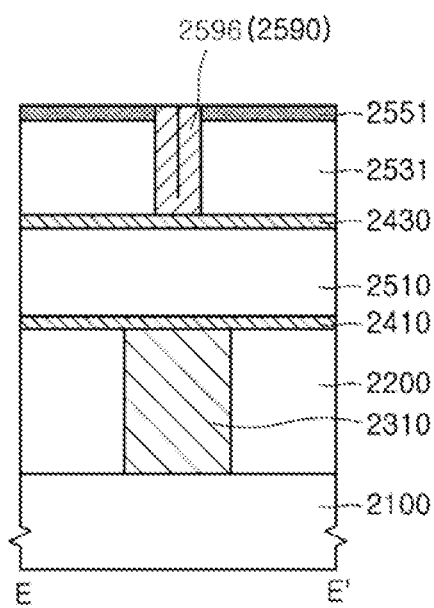

FIGS. 68, 69, 70 and 71 illustrate a step of extending the first and third via cavities 2682 and 2684 (shown in FIGS. 65 and 66). FIG. 68 is a plan view illustrating the extended first and third via cavities 2682 and 2684. FIG. 69 is a cross-sectional view taken along a line C-C' of FIG. 68, FIG. 70 is a cross-sectional view taken along a line D-D' of FIG. 68, and FIG. 71 is a cross-sectional view taken along a line E-E' of FIG. 68.

Referring to FIGS. 68, 69, 70 and 71, using the remaining guide spacer layer 2590 and the polymer block matrixes 2831 and 2833 as etch masks, the second hard mask layer 2430 exposed by the first and third via cavities 2682 and 2684 may be etched to vertically extend the first and third via cavities 2682 and 2684 through the second hard mask layer 2430. After the extended first and third via cavities 2682 and 2684 are formed, the polymer block matrixes 2831 and 2833 may be removed. In some embodiments of the present invention, the extended first and third via cavities 2682 and 2684 may be formed after the polymer block matrixes 2831 and 2833 are removed. The remaining guide spacer layer 2590 may include the bottom portions 2594 and sidewall portions 2593 remaining in the second and fourth nest-shaped recession regions 2694 and 2697 (shown in FIGS. 57 and 58), and the filling portion 2596 filling the first line-shaped recession region 2653.

Figure 72:
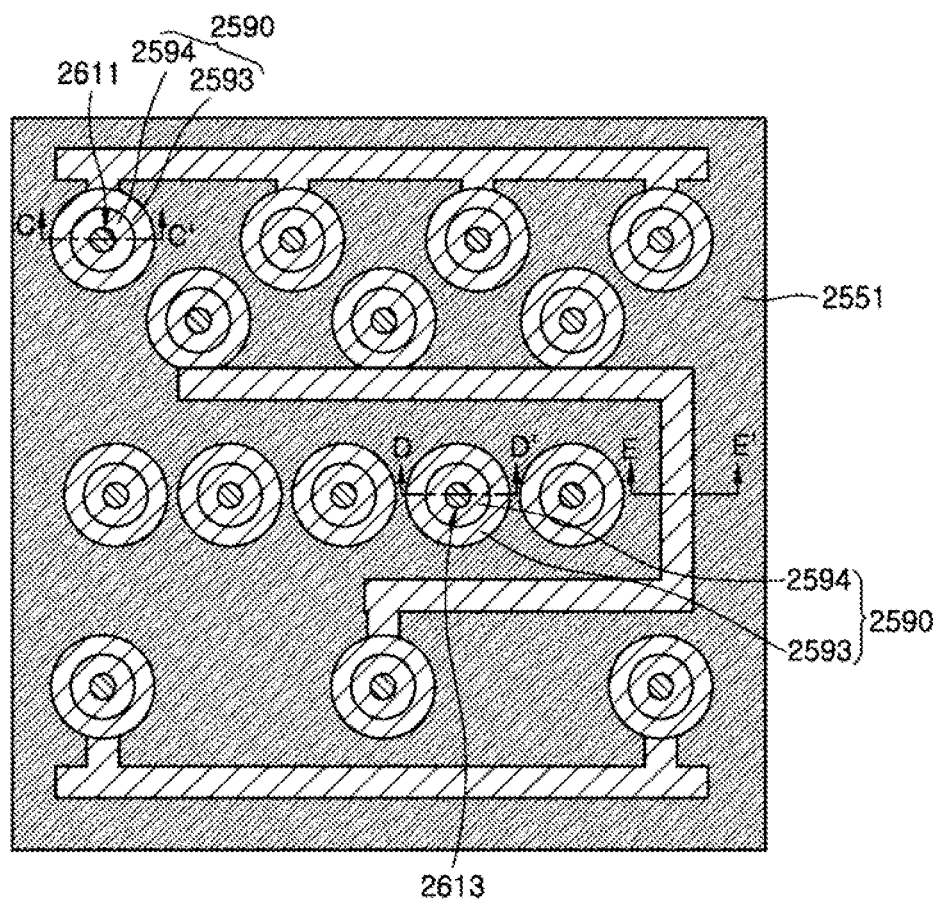
Figure 73:
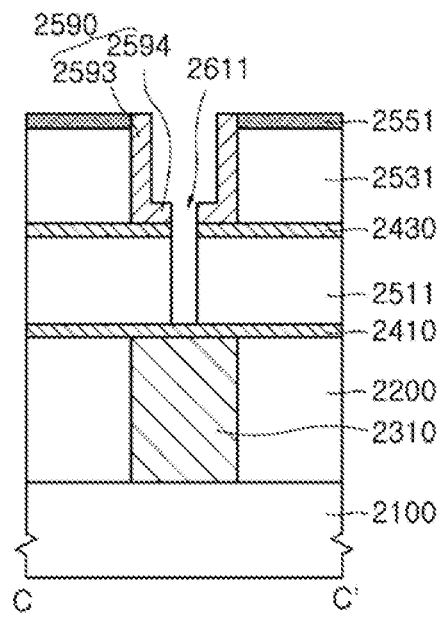
Figure 74:
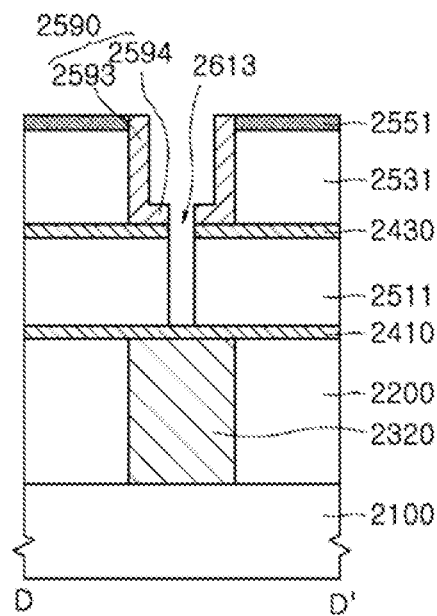
Figure 75:
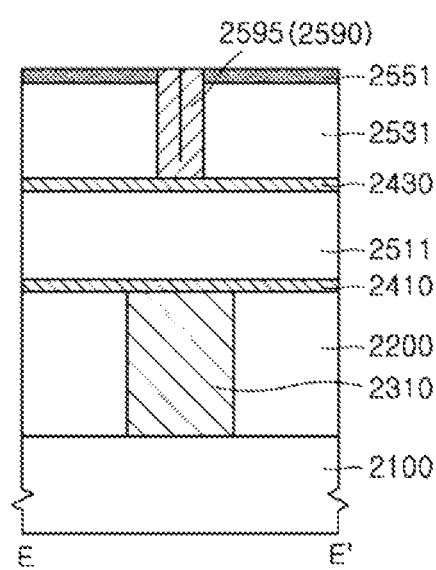

FIGS. 72, 73, 74 and 75 illustrate a step of forming a second via cavity 2611 and a fourth via cavity 2613. FIG. 72 is a plan view illustrating the second and fourth via cavities 2611 and 2613. FIG. 73 is a cross-sectional view taken along a line C-C' of FIG. 72, FIG. 74 is a cross-sectional view taken along a line D-D' of FIG. 72, and FIG. 75 is a cross-sectional view taken along a line E-E' of FIG. 72.

Referring to 72, 73, 74 and 75, the first dielectric layer (2510 of FIGS. 69 and 70) exposed by the first and third via cavities (2682 of FIG. 69 and 2684 of FIG. 70) may be etched to form a second via cavity 2611 that vertically extends from the first via cavity 2682 and a fourth via cavity 2613 that vertically extends from the third via cavity 2684. As a result, a first dielectric pattern 2511 defining the second and fourth via cavities 2611 and 2613 may be formed. The etch process for forming the second and fourth via cavities 2611 and 2613 may be performed using the remaining guide spacer layer 2590 and the third hard mask pattern 2551 as etch masks. When the etch process for forming the second and fourth via cavities 2611 and 2613 is performed, the first hard mask layer 2410 may act as an etch stopper to prevent the first and second lower conductive lines 2310 and 2320 and the insulation layer 2200 from being damaged. The second via cavity 2611 may be aligned with the first via cavity 2682, and the fourth via cavity 2613 may be aligned with the third via cavity 2684.

Figure 76:
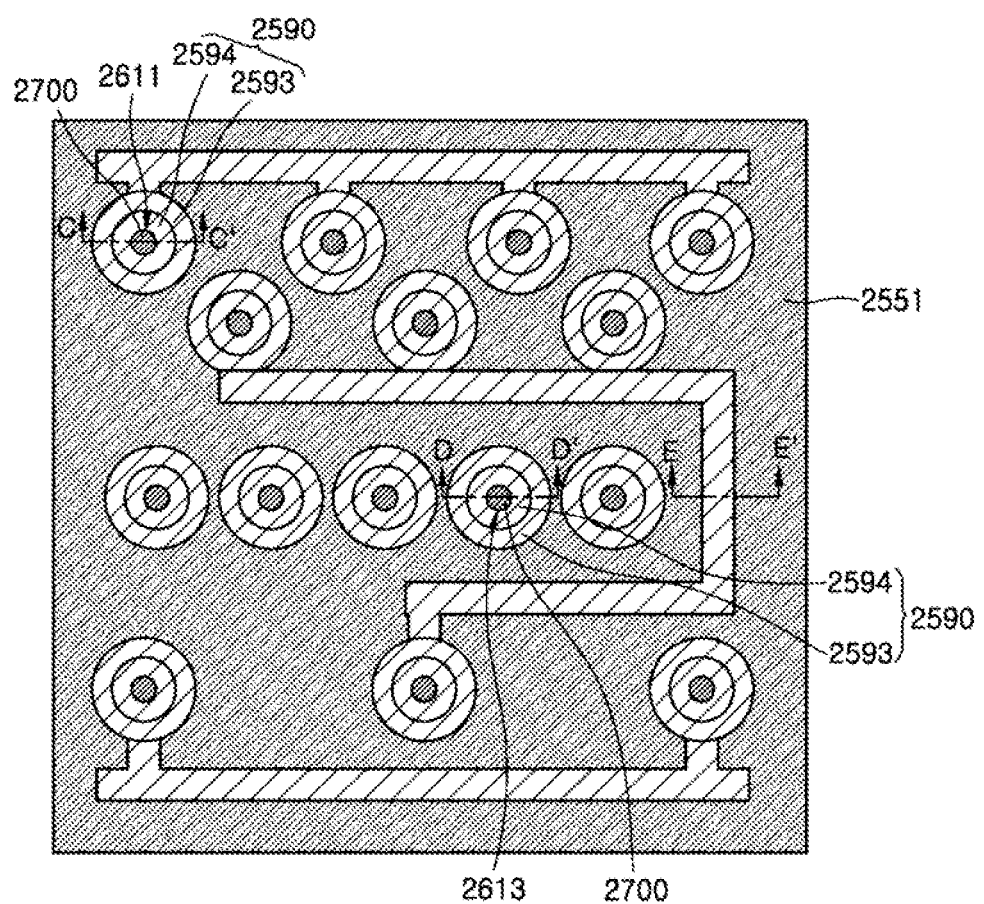
Figure 77:
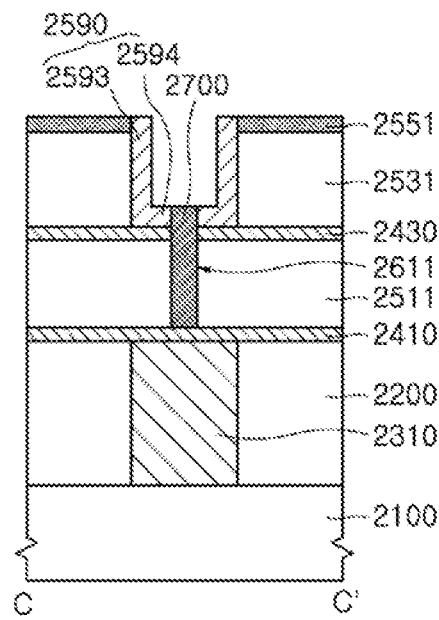
Figure 78:
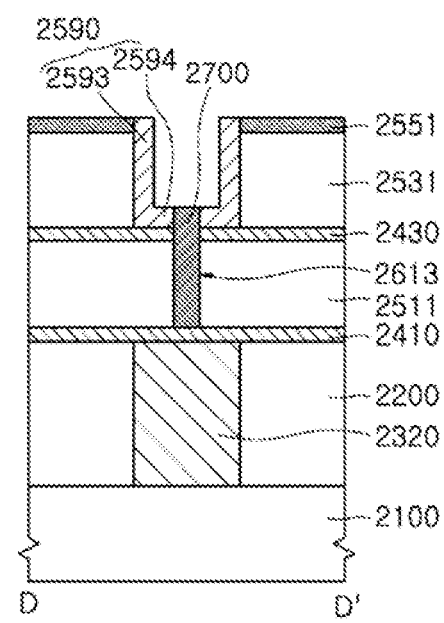
Figure 79:
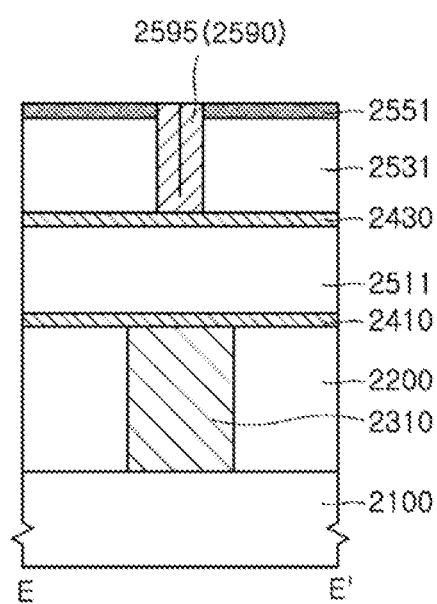

FIGS. 76, 77, 78 and 79 illustrate a step of forming sacrificial via plugs 2700. FIG. 76 is a plan view illustrating the sacrificial via plugs 2700. FIG. 77 is a cross-sectional view taken along a line C-C' of FIG. 76, FIG. 78 is a cross-sectional view taken along a line D-D' of FIG. 76, and FIG. 79 is a cross-sectional view taken along a line E-E' of FIG. 76.

Referring to FIGS. 76, 77, 78 and 79, the sacrificial via plugs 2700 may be formed to fill the second and fourth via cavities 2611 and 2613. Specifically, a sacrificial layer (not shown), for example, a spin-on-carbon (SOC) layer may be formed on the substrate including the second and fourth via cavities 2611 and 2613, and the sacrificial layer may be etched back or recessed to expose a surface of the remaining guide spacer layer 2590 and a surface of the third hard mask pattern 2551. As a result, portions of the sacrificial layer may remain in the second and fourth via cavities 2611 and 2613 to form the sacrificial via plugs 2700. The sacrificial via plugs 2700 may prevent shapes of the second and fourth via cavities 2611 and 2613 from being modified or the first hard mask layer 2410 from being damaged during a subsequent etch process for removing the remaining guide spacer layer 2590.

Figure 80:
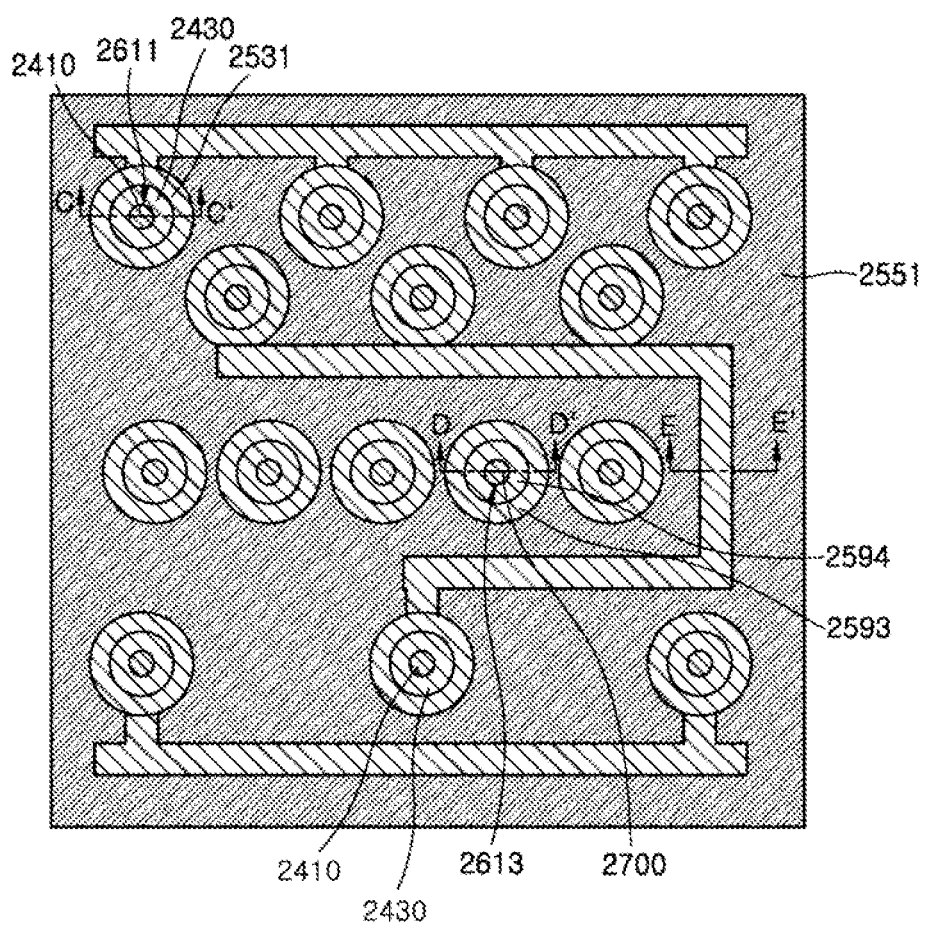
Figure 81:
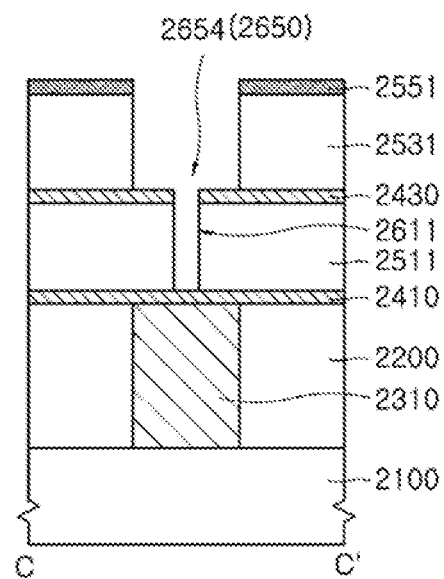
Figure 82:
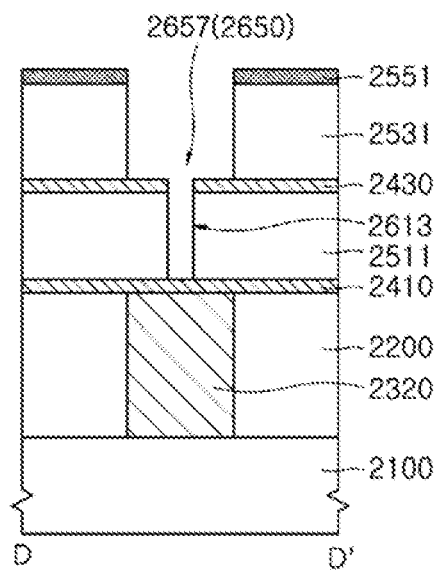
Figure 83:
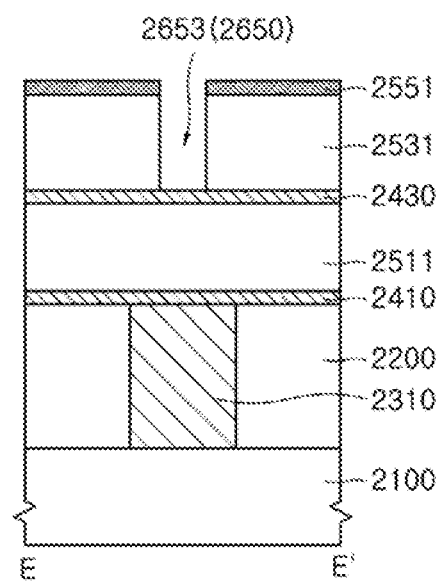

FIGS. 80, 81, 82 and 83 illustrate a step of exposing the first recession region 2650 and the second and fourth via cavities 2611 and 2613. FIG. 80 is a plan view illustrating a resultant where the first recession region 2650 and the second and fourth via cavities 2611 and 2613 are exposed. FIG. 81 is a cross-sectional view taken along a line C-C' of FIG. 80, FIG. 82 is a cross-sectional view taken along a line D-D' of FIG. 80, and FIG. 83 is a cross-sectional view taken along a line E-E' of FIG. 80.

Referring to FIGS. 80, 81, 82 and 83, the remaining guide spacer layer (2590 of FIGS. 77 and 78) may be removed to expose sidewalls and a bottom surface of the first recession region 2650 including the first line-shaped recession region 2653 and the first and third nest-shaped recession regions 2654 and 2657. Moreover, the sacrificial via plugs 2700 may be removed to expose sidewalls and bottom surfaces of the second and fourth via cavities 2611 and 2613.

Figure 84:
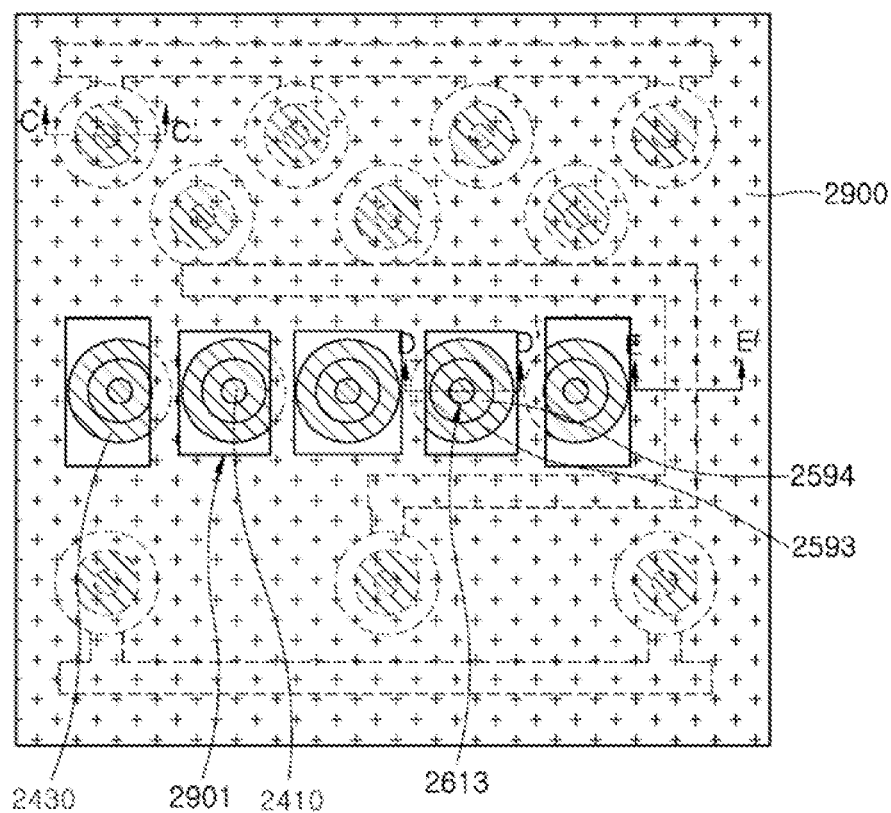
Figure 85:
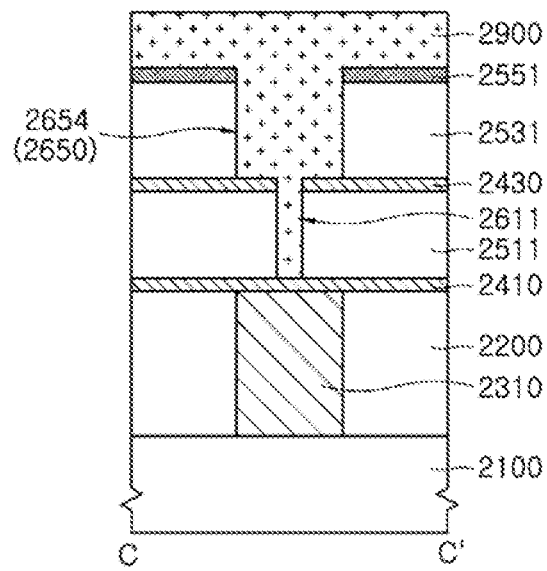
Figure 86:
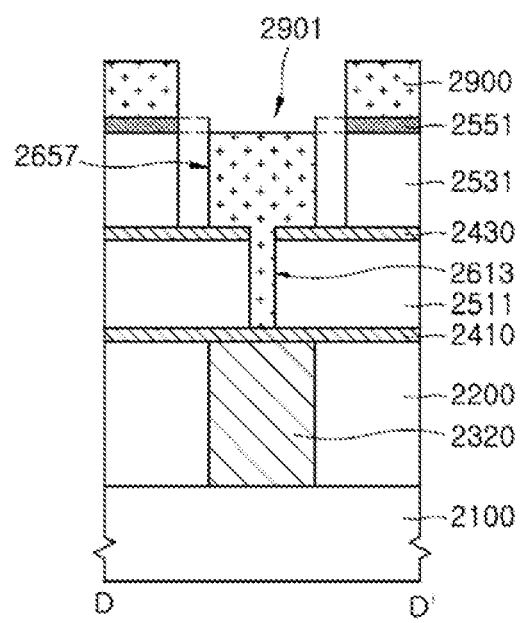
Figure 87:
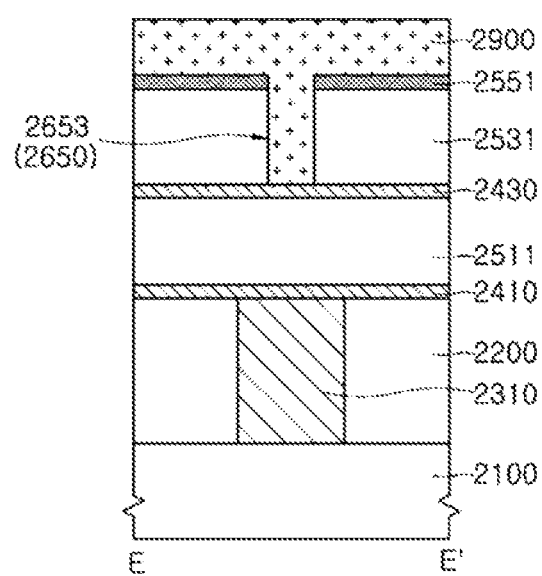

FIGS. 84, 85, 86 and 87 illustrate a step of forming a sacrificial pattern 2900. FIG. 84 is a plan view illustrating the sacrificial pattern 2900. FIG. 85 is a cross-sectional view taken along a line C-C' of FIG. 84, FIG. 86 is a cross-sectional view taken along a line D-D' of FIG. 84, and FIG. 87 is a cross-sectional view taken along a line E-E' of FIG. 84.

Referring to FIGS. 84, 85, 86 and 87, a sacrificial layer 2900 may be formed on the third hard mask pattern 2551 to fill the first recession region 2650 and the second and fourth via cavities 2611 and 2613. The sacrificial layer 2900 may be formed by depositing a dielectric material such as an SOC material. A portion of the sacrificial layer 2900 may be selectively removed to form an opening 2901 disposed on the third nest-shaped recession region 2657. The opening 2901 may be formed to have a width which is greater than the width of the third nest-shaped recession region 2657.

Figure 88:
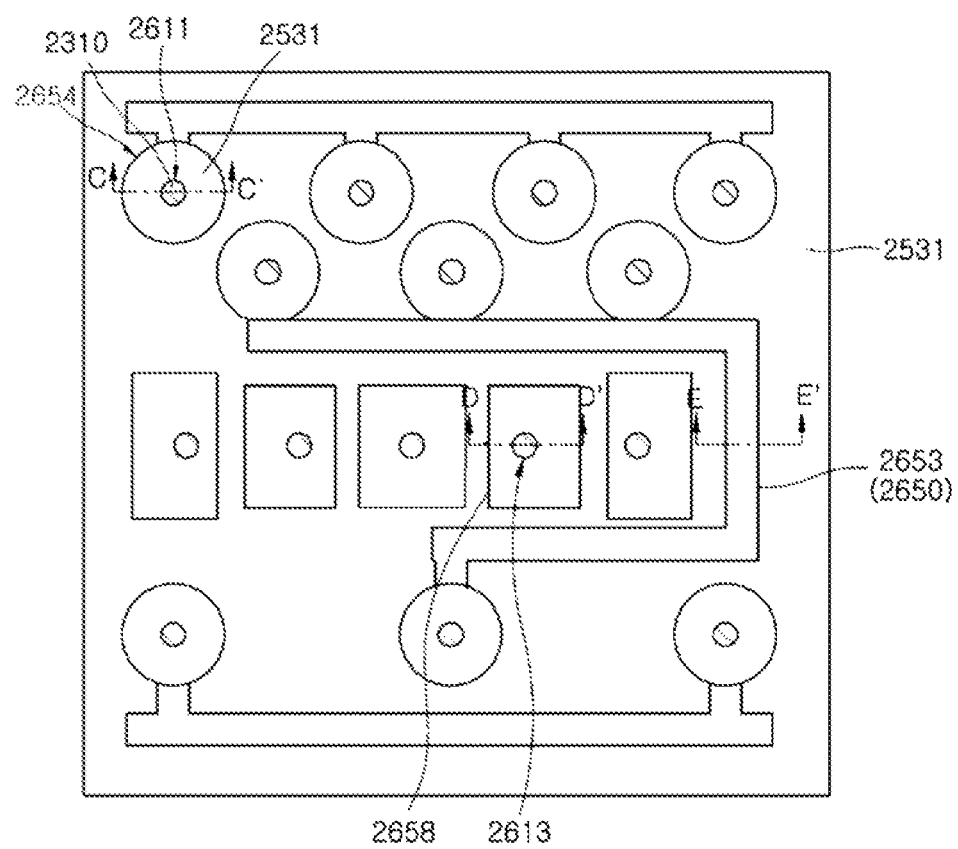
Figure 89:
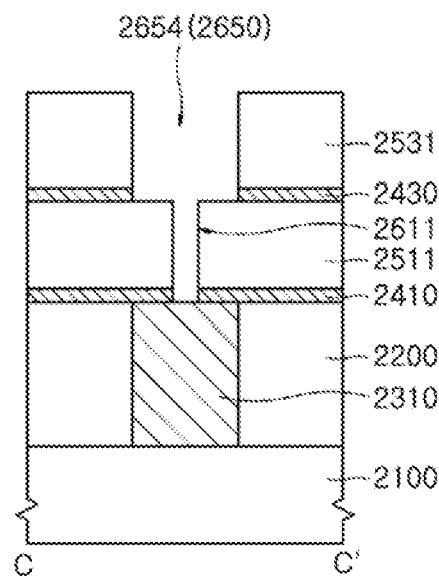
Figure 90:
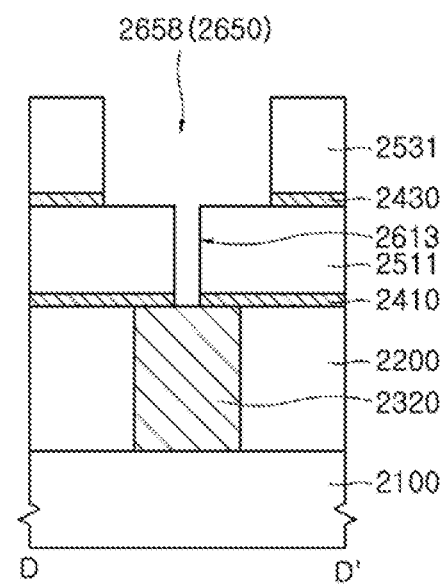
Figure 91:
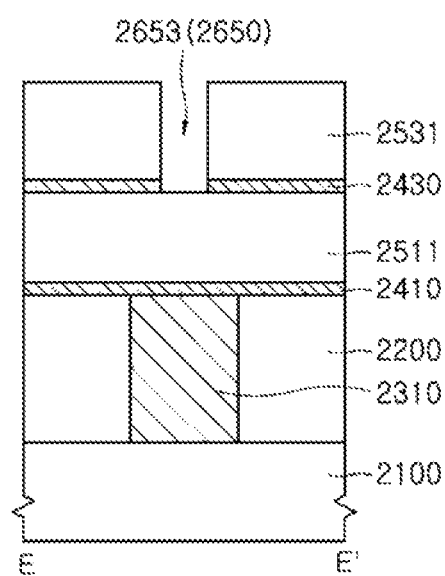

FIGS. 88, 89, 90 and 91 illustrate a step of forming a fifth nest-shaped recession region 2658. FIG. 88 is a plan view illustrating the fifth nest-shaped recession region 2658. FIG. 89 is a cross-sectional view taken along a line C-C' of FIG. 88, FIG. 90 is a cross-sectional view taken along a line D-D' of FIG. 88, and FIG. 91 is a cross-sectional view taken along a line E-E' of FIG. 88.

Referring to FIGS. 88, 89, 90 and 91, using the sacrificial layer 2900 having the opening 2901 as an etch mask, the second dielectric pattern 2531 may be etched to enlarge the third nest-shaped recession region 2657. As a result, the fifth nest-shaped recession region 2658 may be formed on the fourth via cavity 2613. The fifth nest-shaped recession region 2658 may provide a space in which the conductive pad, for example, 54 of FIG. 37, is formed. Thus, the shape and location of the conductive pad 54 may depend on the shape and location of the fifth nest-shaped recession region 2658. That is, the shape and location of the conductive pad 54 may be modified in various forms according to the shape and location of the openings 2901.

After the fifth nest-shaped recession region 2658 is formed, the sacrificial layer 2900 may be removed. Subsequently, the first hard mask layer 2410 exposed by the second and fourth via cavities 2611 and 2613 may be etched to expose the first and second lower conductive lines 2310 and 2320. While the first hard mask layer 2410, exposed by the second and fourth via cavities 2611 and 2613, is etched, the second hard mask layer 2430, exposed by the first recession region 2650, may be removed. Moreover, while the first hard mask layer 2410, exposed by the second and fourth via cavities 2611 and 2613 is etched, the third hard mask pattern 2551 may also be removed.

The fourth via cavity 2613 may be spatially connected to the fifth nest-shaped recession region 2658. In some embodiments of the present invention, the fourth via cavity 2613 may not be aligned with a central portion of the fifth nest-shaped recession region 2658.

Figure 92:
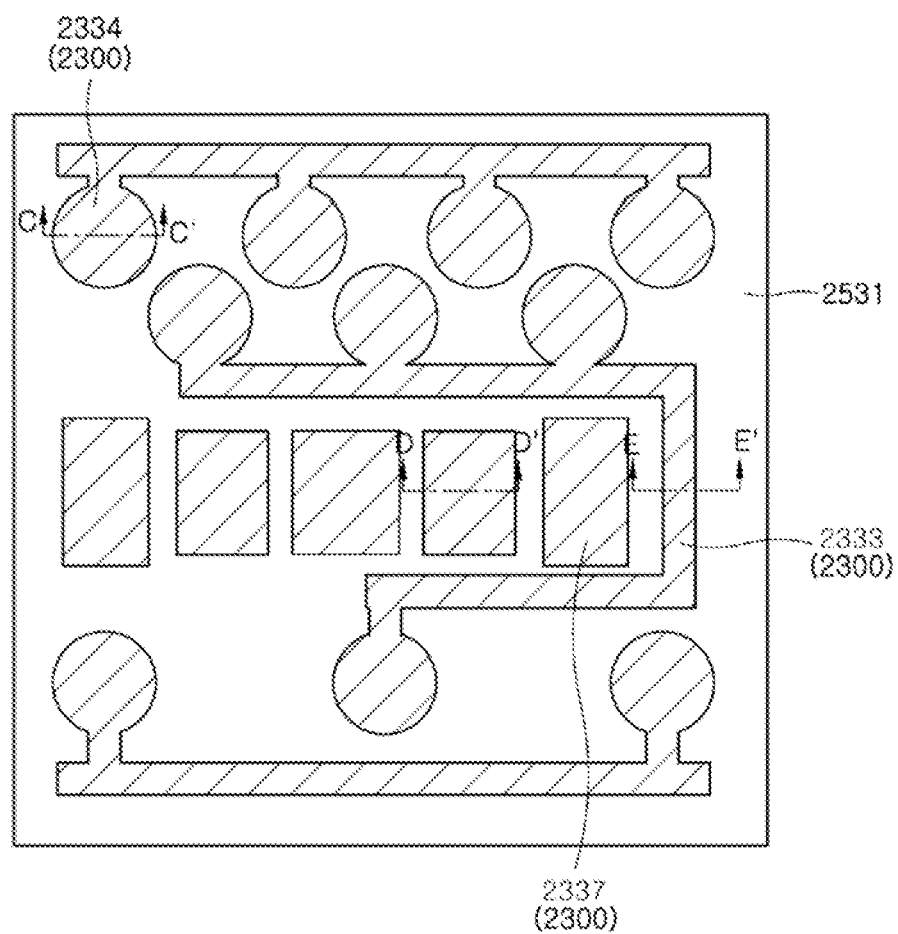
Figure 93:
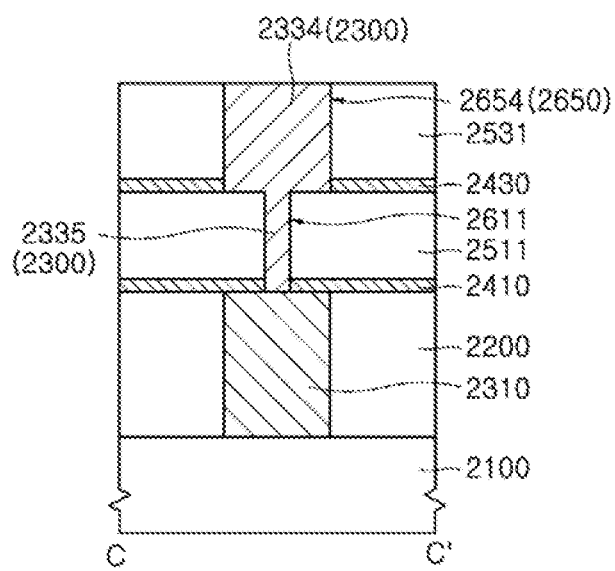
Figure 94:
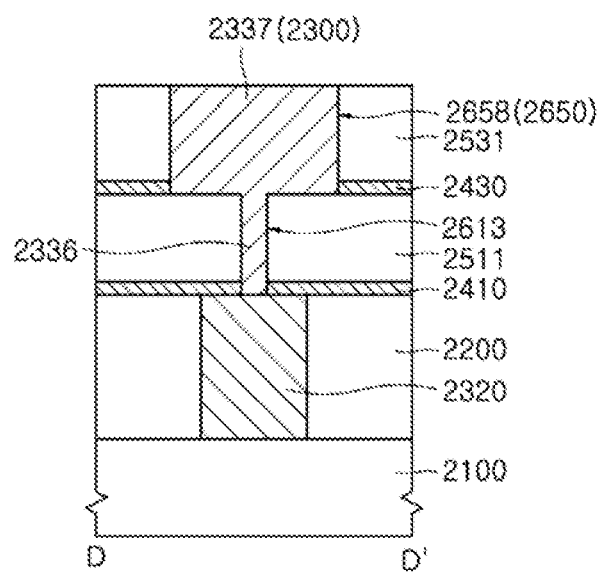
Figure 95:
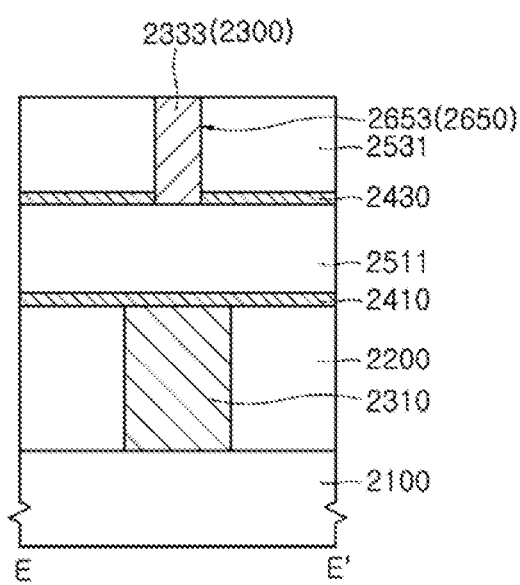

FIGS. 92, 93, 94 and 95 illustrate a step of forming an upper conductive pattern 2300. FIG. 92 is a plan view illustrating the upper conductive pattern 2300. FIG. 93 is a cross-sectional view taken along a line C-C' of FIG. 92, FIG. 94 is a cross-sectional view taken along a line D-D' of FIG. 92, and FIG. 95 is a cross-sectional view taken along a line E-E' of FIG. 92.

Referring to FIGS. 92, 93, 94 and 95, an upper conductive layer (not shown) may be formed on the third hard mask pattern 2551 or the second dielectric pattern 2531 to fill the second and fourth via cavities 2611 and 2613 and the first recession region 2650. The upper conductive layer may then be planarized to form the upper conductive pattern 2300 including an upper conductive line 2333 in the first line-shaped recession region 2653, a connection portion 2334 in the first nest-shaped recession region 2654, a conductive pad 2337 in the fifth nest-shaped recession region 2658, a first conductive via 2335 in the second via cavity 2611, aligned with the connection portion 2334, and a second conductive via 2336 in the fourth via cavity 2613. The planarization process for forming the upper conductive pattern 2300 may be performed using a chemical mechanical polishing (CMP) process to expose the second dielectric pattern 2531. The upper conductive pattern 2300 may be formed to include a metal material such as a copper (Cu) material, an aluminum (Al) material or a tungsten (W) material.

Although FIGS. 40 to 95 illustrate an example in which the first line-shaped recession region 2653 is completely filled with the guide spacer layer 2590, the inventive concept is not limited thereto. For example, in some embodiments of the present invention, the guide spacer layer 2590 may be conformably formed on sidewalls and a bottom surface of the first line-shaped recession region 2653 without filling the first line-shaped recession region 2653, similar to the guide spacer layer 590 illustrated in the previous embodiment (see FIGS. 11 and 12). Additionally, in some embodiments of the present invention, the guide spacer layer 590 illustrated in FIG. 12 may be formed to completely fill the first line-shaped recession region 653, similar to the guide spacer layer 2590 illustrated in FIG. 51.

According to the embodiments described above, nano-scale structures or nano structures may be readily fabricated on a large substrate using phase separation of a block co-polymer (BCP) layer. The nano-scale structures may be used in fabrication of polarizing plates or in the formation of reflective lenses in reflective liquid crystal display (LCD) units. The nano structures may also be used in the fabrication of separate polarizing plates as well as in the formation of polarizing parts including display panels. For example, the nano structures may be used in fabrication of array substrates including thin film transistors or in processes for directly forming polarizing parts on color filter substrates. Further, the nano structures may be used in molding processes for fabricating nanowire transistors or memories, electronic/electric components for patterning nano-scaled interconnections, catalysts of solar cells and fuel cells, etch masks, organic light emitting diodes (OLEDs), and gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products such as mother boards or end products that constitute signal processing devices. The end products may include toys, low end application products, or high end application products such as computers. For example, the end products may include display units, keyboards, or central processing units (CPUs).

The embodiments of the present invention have been disclosed above for illustrative purposes. Those of ordinary skill in the art will appreciate that various modifications, additions, and substitutions are possible, without departing from the scope and spirit of the present invention as expressed in the accompanying claims.

What is claimed is:

1. A method of fabricating an interconnection structure, the method comprising:
   forming a dielectric layer on a semiconductor substrate;
   patterning the dielectric layer to form a first recession region including a first nest-shaped recession region having a first width and a first line-shaped recession region having a second width, which is less than the first width;
   forming a guide spacer layer on sidewalls of the first recession region to provide a second recession region including a second nest-shaped recession region, which is disposed in the first nest-shaped recession region and has a third width that is less than the first width;
   forming a self-assembling block copolymer material that fills the second recession region;
   annealing the self-assembling block copolymer material to form a polymer block domain having a circular pillar shape and a polymer block matrix surrounding the polymer block domain to have a cylindrical shape;
   removing the polymer block domain; and
   etching the dielectric layer using the polymer block matrix as an etch mask and forming a via cavity under the second nest-shaped recession region.

2. The method of claim 1, wherein the first nest-shaped recession region is spatially connected to the first line-shaped recession region.

3. The method of claim 2, wherein the first nest-shaped recession region is connected to an end of the first line-shaped recession region or is disposed to overlap with a portion of the first line-shaped recession region.

4. The method of claim 1, wherein the first nest-shaped recession region is spaced apart from the first line-shaped recession region.

5. The method of claim 1, wherein the guide spacer layer is appropriately sized such that the polymer block domain is formed in the second nest-shaped recession region.

6. The method of claim 5,
   wherein the guide spacer layer is formed to provide a second line-shaped recession region that is disposed in the first line-shaped recession region to have a fourth width, which is less than the third width; and
   wherein the fourth width of the second line-shaped recession region is such that it prevents the polymer block domain from being formed in the second line-shaped recession region.

7. The method of claim 5, wherein the guide spacer layer is formed to fill the first line-shaped recession region such that the polymer block domain is formed in the first line-shaped recession region.

8. The method of claim 1, wherein the guide spacer layer is formed to extend onto a bottom surface of the first recession region and onto a top surface of the dielectric layer.

9. The method of claim 1, wherein the guide spacer layer includes a material having an etch selectivity with respect to the dielectric layer.

10. The method of claim 1, wherein the guide spacer layer includes a silicon layer or a titanium nitride layer.

11. The method of claim 1, wherein the self-assembling block copolymer material includes a first polymer block component and a second polymer block component, which are suitable for being molecularly linked and forming separate phases when brought to an annealing temperature.

12. The method of claim 11, wherein the polymer block domain includes the first polymer block component and the polymer block matrix includes the second polymer block component.

13. The method of claim 11, wherein the polymer block domain is formed of the first polymer block component, which exists in a separate phase than the self-assembling block copolymer material.

14. The method of claim 1, wherein the via cavity is formed to penetrate the dielectric layer.

15. The method of claim 14, further comprising:
forming a conductive layer that fills the first recession region and the via cavity;
planarizing the conductive layer to form a conductive line in the first recession region and a conductive via in the via cavity.

16. The method of claim 15, wherein forming the conductive layer is preceded by:
removing the polymer block matrix; and
removing the guide spacer layer.

17. The method of claim 16, wherein removing the guide spacer layer includes:
forming a sacrificial layer in the via cavity; and
etching the guide spacer layer using the sacrificial layer as an etch mask.

18. The method of claim 1, wherein the via cavity is aligned with a central portion of a bottom surface of the first nest-shaped recession region.

19. A method of fabricating an interconnection structure, the method comprising:
sequentially stacking a first dielectric layer and a second dielectric layer on a semiconductor substrate;
patterning the second dielectric layer to form a first recession region including a first nest-shaped recession region having a first width and a first line-shaped recession region having a second width, which is less than the first width;
forming a guide spacer layer on sidewalls of the first recession region to provide a second recession region in the first recession region, wherein the second recession region includes a second nest-shaped recession region disposed in the first nest-shaped recession region to have a third width that is less than the first width, and a second line-shaped recession region disposed in the first line-shaped recession region to have a fourth width that is less than the second width;
forming a self-assembling block copolymer material that fills the second recession region;
annealing the self-assembling block copolymer material to form a circular pillar-shaped polymer block domain and a cylinder-shaped polymer block matrix, surrounding the circular pillar-shaped polymer block domain, in the second nest-shaped recession region;
removing the circular pillar-shaped polymer block domain;
etching the guide spacer layer exposed by the cylinder-shaped polymer block matrix to form a first via cavity; and
etching the first dielectric layer using the cylinder-shaped polymer block matrix as an etch mask to form a second via cavity that is deeper than the first via cavity.

20. A method of fabricating an interconnection structure, the method comprising:
sequentially stacking a first dielectric layer and a second dielectric layer on a semiconductor substrate;
patterning the second dielectric layer to form a first recession region including a first nest-shaped recession region having a first width, a third nest-shaped recession region having a fifth width, and a first line-shaped recession region having a second width, which is less than the first and fifth widths, wherein the first line-shaped recession region is connected to the first nest-shaped recession region and spaced apart from the third nest-shaped recession region;
forming a guide spacer layer on sidewalls of the first recession region to provide a second recession region in the first recession region, wherein the second recession region includes a second nest-shaped recession region disposed in the first nest-shaped recession region to have a third width that is less than the first width and a fourth nest-shaped recession region disposed in the third nest-shaped recession region to have a sixth width that is less than the fifth width;
forming a self-assembling block copolymer material that fills the second and fourth nest-shaped recession regions;
annealing the self-assembling block copolymer material to form a circular pillar-shaped polymer block domain and a cylinder-shaped polymer block matrix, surrounding the circular pillar-shaped polymer block domain, in each of the second and fourth nest-shaped recession regions;
removing the circular pillar-shaped polymer block domains;
etching the guide spacer layer exposed by the cylinder-shaped polymer block matrixes to form a first via cavity in the second nest-shaped recession region and a third via cavity in the fourth nest-shaped recession region;
etching the first dielectric layer exposed by the first and third via cavities to form a second via cavity that is deeper than the first via cavity and a fourth via cavity that is deeper than the third via cavity;
etching a portion of the second dielectric layer, adjacent to the third nest-shaped recession region, to form a fifth nest-shaped recession region having a seventh width that is greater than the fifth width;
forming a conductive layer that fills the fifth nest-shaped recession region, the first line-shaped recession region, the second via cavity, and the fourth via cavity; and
planarizing the conductive layer to form a conductive pad in the fifth nest-shaped recession region, a first conductive via in the second via cavity, a second conductive via in the fourth via cavity, and a conductive line in the first line-shaped recession region.

* * * * *